(12) United States Patent
Kim et al.

(10) Patent No.: US 12,369,398 B2
(45) Date of Patent: Jul. 22, 2025

(54) DISPLAY APPARATUS

(71) Applicant: Samsung Display Co., Ltd., Yongin-si (KR)

(72) Inventors: Hyuk Kim, Yongin-si (KR); Yanghwa Choi, Yongin-si (KR); Junghwan Hwang, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 822 days.

(21) Appl. No.: 17/670,074

(22) Filed: Feb. 11, 2022

(65) Prior Publication Data

US 2022/0352298 A1 Nov. 3, 2022

(30) Foreign Application Priority Data

May 3, 2021 (KR) .................. 10-2021-0057484

(51) Int. Cl.
*H10D 86/40* (2025.01)
*H10K 59/131* (2023.01)

(52) U.S. Cl.
CPC ......... *H10D 86/441* (2025.01); *H10K 59/131* (2023.02); *H10K 59/1315* (2023.02)

(58) Field of Classification Search
CPC . H10D 86/441; H10K 59/131; H10K 59/1315
USPC ........................................................ 257/40
See application file for complete search history.

(56) References Cited

U.S. PATENT DOCUMENTS

| | | | |
|---|---|---|---|
| 7,196,745 B2 | 3/2007 | Enda et al. | |
| 9,997,586 B2 | 6/2018 | Kim | |
| 10,468,477 B2 | 11/2019 | Jung et al. | |
| 10,811,438 B2* | 10/2020 | Choi | H10D 86/441 |
| 10,825,884 B2 | 11/2020 | Liu | |
| 2017/0317155 A1* | 11/2017 | Oh | H10D 86/60 |
| 2018/0097016 A1 | 4/2018 | Yang et al. | |
| 2020/0321427 A1 | 10/2020 | Park et al. | |
| 2020/0343326 A1 | 10/2020 | Park et al. | |

(Continued)

FOREIGN PATENT DOCUMENTS

| | | |
|---|---|---|
| CN | 109004012 | 12/2018 |
| KR | 10-0731703 | 6/2007 |

(Continued)

*Primary Examiner* — Xia L Cross
(74) *Attorney, Agent, or Firm* — KILE PARK REED & HOUTTEMAN PLLC

(57) ABSTRACT

A display apparatus includes: a first substrate; a scan line extending in a first direction; a data line that extends in a second direction; a sensing line that extends in the second direction; a switching transistor electrically connected to the scan and the data lines; a driving transistor electrically connected to the switching transistor; a sensing transistor electrically connected to the driving transistor and electrically connected to the sensing line; a first insulating layer between the first substrate and a sensing semiconductor layer of the sensing transistor; a via insulating layer provided on the switching transistor, the driving transistor, and the sensing transistors; and a light-emitting diode including a first electrode, an emission layer, and a second electrode, the first electrode provided on the via insulating layer, wherein the sensing line is below the first insulating layer and overlaps the first electrode of the light-emitting diode.

21 Claims, 21 Drawing Sheets

(56) References Cited

U.S. PATENT DOCUMENTS

| | | |
|---|---|---|
| 2020/0365077 A1 | 11/2020 | Park et al. |
| 2021/0091159 A1 | 3/2021 | Lee et al. |
| 2021/0098749 A1 | 4/2021 | Choi et al. |
| 2021/0104578 A1 | 4/2021 | Jo et al. |

FOREIGN PATENT DOCUMENTS

| | | |
|---|---|---|
| KR | 10-1213492 | 12/2012 |
| KR | 10-2017-0050369 | 5/2017 |
| KR | 10-2018-0036866 | 4/2018 |
| KR | 10-2018-0047540 | 5/2018 |
| KR | 10-2020-0124798 | 11/2020 |
| KR | 10-2021-0002170 | 1/2021 |
| KR | 10-2021-0033683 | 3/2021 |
| KR | 10-2021-0042216 | 4/2021 |

\* cited by examiner

DISPLAY APPARATUS

CROSS-REFERENCE TO RELATED APPLICATION

This application claims priority from and the benefit of Korean Patent Application No. 10-2021-0057484, filed on May 3, 2021, which is hereby incorporated by reference for all purposes as if fully set forth herein.

BACKGROUND

Field

Embodiments of the invention relate generally to a display apparatus.

Discussion of the Background

With the rapid development of the field of displays that visually express various pieces of electric signal information, various display apparatuses having excellent characteristics such as being lightweight, being thinner, and having low power consumption have been introduced.

Display apparatuses may include liquid-crystal display apparatuses that use light from a backlight unit without spontaneously emitting light or light-emitting display apparatuses that include display elements emitting light. A light-emitting display apparatus may include display elements including an emission layer.

The above information disclosed in this Background section is only for understanding of the background of the inventive concepts, and, therefore, it may contain information that does not constitute prior art.

SUMMARY

Devices constructed according to illustrative implementations of the invention are capable of preventing a parasitic capacitance between a sensing line and a neighboring electrode (e.g., a first electrode of a light-emitting diode) of a display device, to thereby improve the operability of the display device.

One or more embodiments include a display apparatus, and more particularly, include a structure regarding a light-emitting display apparatus.

Additional features of the inventive concepts will be set forth in the description which follows, and in part will be apparent from the description, or may be learned by practice of the inventive concepts.

According to one or more embodiments, a display apparatus includes a first substrate, a scan line extending in a first direction over the first substrate, a data line extending in a second direction crossing the first direction, a sensing line extending in the second direction, a switching transistor electrically connected to the scan line and the data line, a driving transistor electrically connected to the switching transistor, a sensing transistor electrically connected to the driving transistor and electrically connected to the sensing line, a first insulating layer arranged between the first substrate and a sensing semiconductor layer of the sensing transistor, a via insulating layer provided on the switching transistor, the driving transistor, and the sensing transistor, and a light-emitting diode including a first electrode, an emission layer, and a second electrode, the first electrode being provided on the via insulating layer, the emission layer being provided on the first electrode, and the second electrode being provided on the emission layer, wherein the sensing line is arranged below the first insulating layer and overlaps the first electrode of the light-emitting diode.

The sensing semiconductor layer of the sensing transistor may overlap the first electrode of the light-emitting diode.

The display apparatus may further include an auxiliary sensing line overlapping the sensing line and arranged in a same layer as a sensing gate electrode of the sensing transistor.

The auxiliary sensing line may overlap the first electrode of the light-emitting diode.

The auxiliary sensing line may include a same material as that of the sensing gate electrode.

The display apparatus may further include a connector arranged on the auxiliary sensing line and electrically connecting the auxiliary sensing line to the sensing semiconductor layer of the sensing transistor.

The display apparatus may further include a connector electrically connecting a portion of the sensing semiconductor layer to the sensing line.

The display apparatus may further include a second insulating layer on the sensing semiconductor layer, and a third insulating layer on the second insulating layer, wherein the sensing semiconductor layer may include a sensing gate electrode arranged on the second insulating layer, and the connector may be arranged on the third insulating layer.

The display apparatus may further include a conductive part arranged on the sensing line, overlapping a portion of the sensing line, and connected to the sensing line.

The conductive part may be arranged on the third insulating layer and may not overlap the first electrode of the light-emitting diode.

A width of the conductive part in the first direction may be less than a length of the conductive part in the second direction.

The display apparatus may further include a common voltage line extending in the second direction, and an auxiliary common voltage line arranged on the common voltage line and electrically connected to the common voltage line.

The auxiliary common voltage line may include a main portion overlapping the common voltage line, and an extension portion extending from the main portion and overlapping the sensing line and the first electrode of the light-emitting diode.

According to one or more embodiments, a display apparatus includes a light-emitting panel including light-emitting diodes, and a color panel arranged on the light-emitting panel and configured to convert or transmit light emitted from the light-emitting diodes, wherein the light-emitting panel includes a first substrate, a scan line extending in a first direction over the first substrate, a data line extending in a second direction crossing the first direction, a sensing line extending in the second direction, a switching transistor electrically connected to the scan line and the data line, a driving transistor electrically connected to the switching transistor, a sensing transistor electrically connected to the driving transistor and electrically connected to the sensing line, and a first insulating layer arranged between the first substrate and a sensing semiconductor layer of the sensing transistor, wherein the sensing line overlaps a first electrode of one of the light-emitting diodes and is arranged under the first insulating layer.

The display apparatus may further include an auxiliary sensing line overlapping the sensing line and arranged in a same layer as a sensing gate electrode of the sensing transistor.

The auxiliary sensing line may overlap the first electrode and include a same material as the sensing gate electrode.

The display apparatus may further include a connector electrically connecting a portion of the sensing semiconductor layer to the sensing line.

The display apparatus may further include a second insulating layer on the sensing semiconductor layer, and a third insulating layer on the second insulating layer, wherein the sensing semiconductor layer may include a sensing gate electrode arranged on the second insulating layer, and the connector may be arranged on the third insulating layer.

The display apparatus may further include a conductive part arranged on the sensing line, overlapping a portion of the sensing line, and connected to the sensing line.

The conductive part may be arranged on the third insulating layer and may not overlap the first electrode.

The display apparatus may further include a common voltage line extending in the second direction, and an auxiliary common voltage line arranged on the common voltage line and electrically connected to the common voltage line, wherein a portion (see FIG. 10, a-VSLe) of the auxiliary common voltage line may overlap the sensing line and the first electrode.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1A:
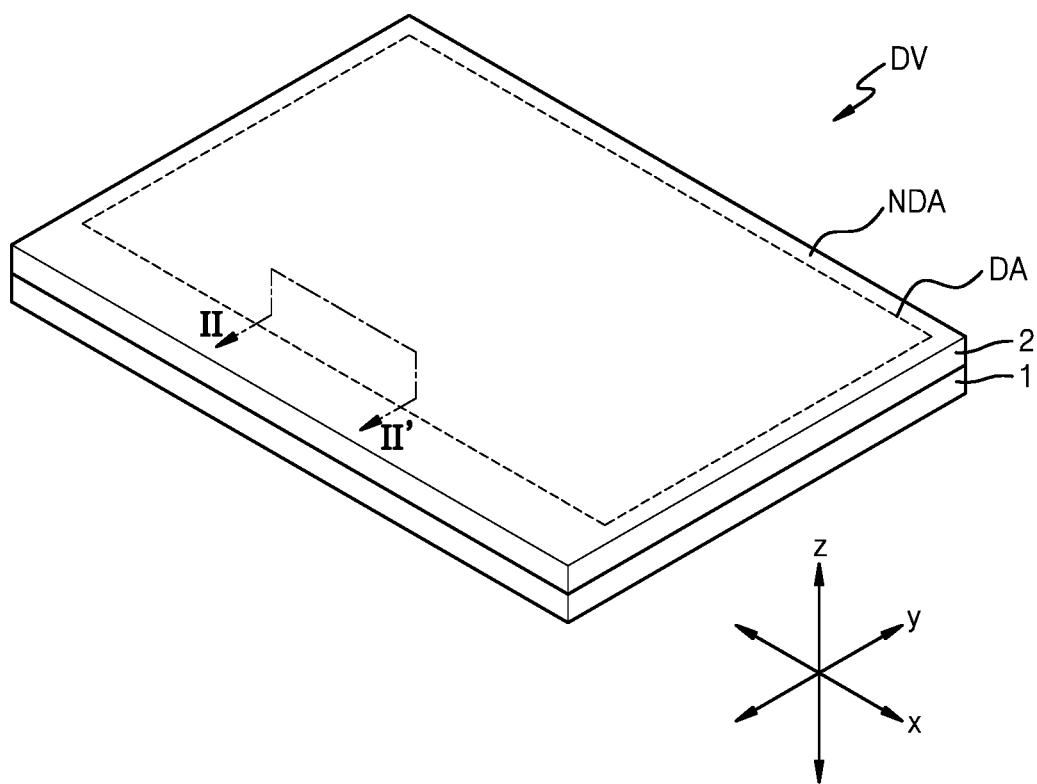
FIG. 1A is a perspective view of a display apparatus according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
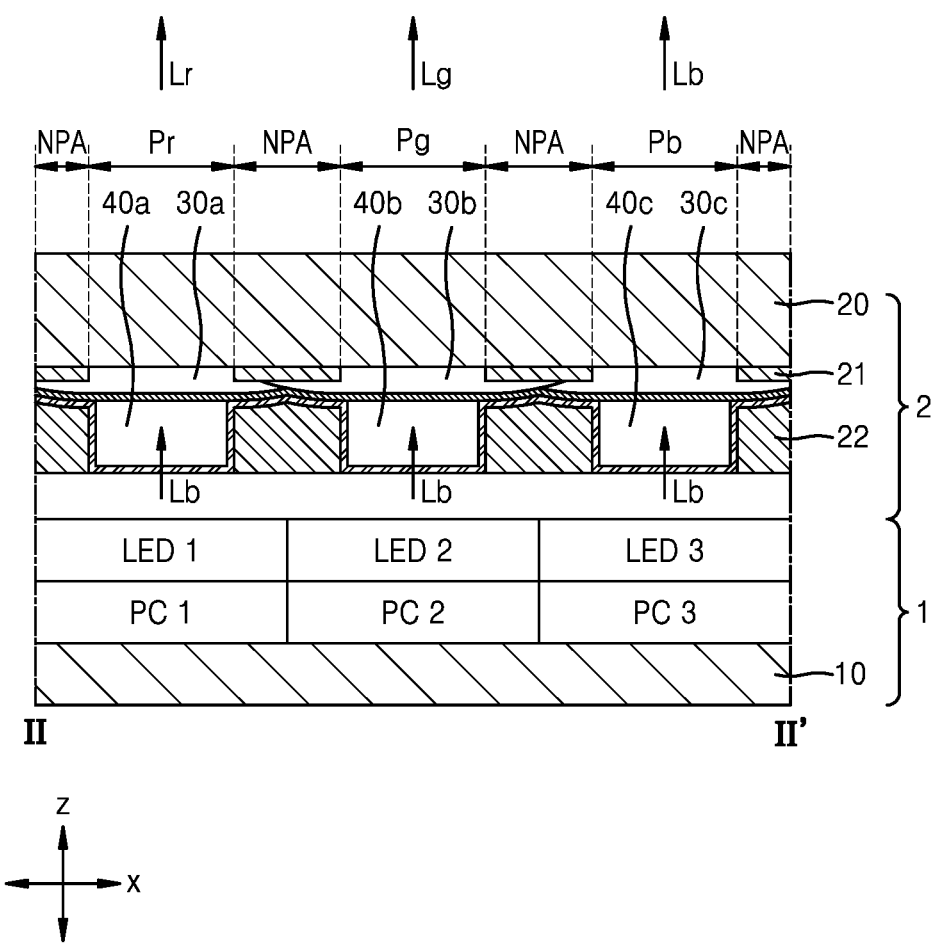
FIG. 1B is a cross-sectional view of the display apparatus of FIG. 1A taken along line II-II' in FIG. 1A, according to an embodiment.
Figure 1C:
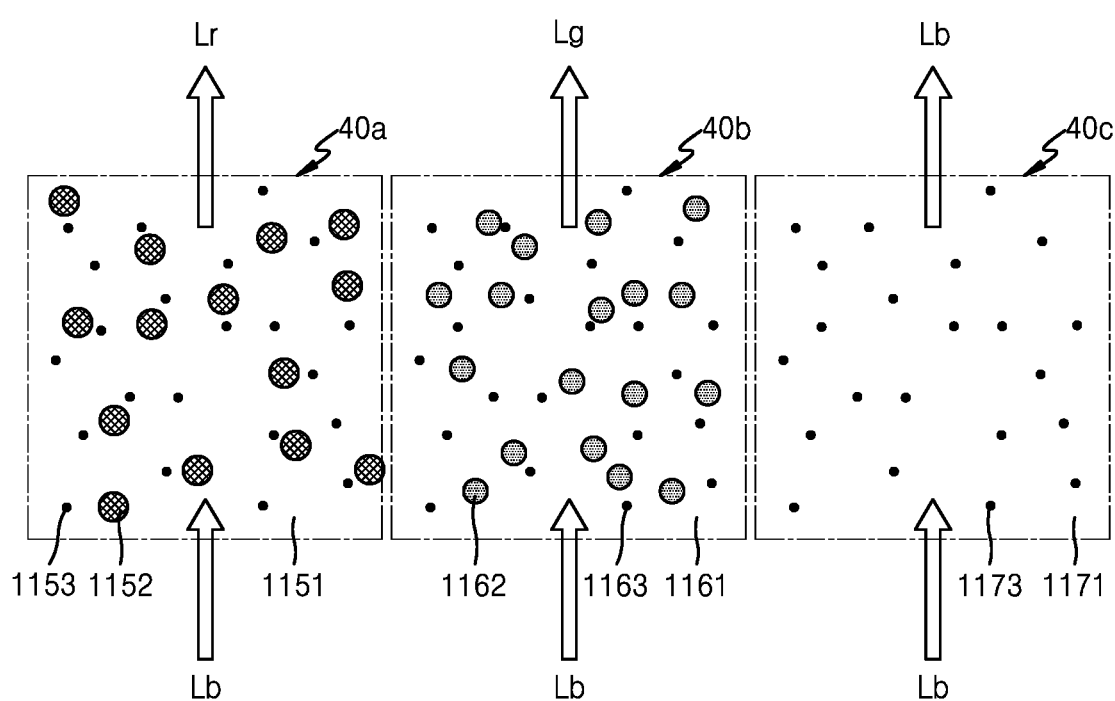
FIG. 1C is a view of respective portions of a color conversion-transmission layer of FIG. 1B.

FIG. 1A is a perspective view of a display apparatus DV according to an embodiment that is constructed according to principles of the invention, FIG. 1B is a cross-sectional view of the display apparatus DV taken along line II-II' according to an embodiment, and FIG. 1C is a view of respective portions of a color conversion-transmission layer of FIG. 1B.

Referring to FIG. 1A, the display apparatus DV may include a display area DA and a non-display area NDA outside the display area DA. The display apparatus DV may display an image through an array of a plurality of pixels two-dimensionally arranged on an x-y plane.

Each pixel is a region that may emit light of a preset color. The display apparatus DV may display an image by using pieces of light emitted from the pixels. As an example, each pixel may emit red, green, or blue light.

The non-display area NDA is a region in which an image is not displayed and may surround the display area DA entirely. A driver or a main power line may be arranged in the non-display area NDA, the driver or the main power line being for providing electric signals or power to the pixels. A pad may be included in the non-display area NDA, the pad being a region to which electronic elements or a printed circuit board may be electrically connected.

As shown in FIG. 1A, the display area DA may have a polygonal shape including a quadrangle. As an example, the display area DA may have a rectangular shape in which a horizontal length thereof is greater than a vertical length thereof, have a rectangular shape in which a horizontal length thereof is less than a vertical length thereof, or have a square shape. Alternatively, the display area DA may have various shapes such as an elliptical shape or a circular shape.

In an embodiment, the display apparatus DV may include a light-emitting panel 1 and a color panel 2 that are stacked in a thickness direction (e.g. a z-direction). Referring to FIG. 1B, the light-emitting panel 1 may include first to third pixel circuits PC1, PC2, and PC3 and first to third light-emitting diodes LED1, LED2, and LED3 respectively connected thereto, the first to third pixel circuits PC1, PC2, and PC3 being on a first substrate 10.

Beams of light (e.g. blue light Lb) emitted from the first to third light-emitting diodes LED1, LED2, and LED3 may be converted to red light Lr or green light Lg, or pass as blue light Lb while passing through the color panel 2. A region from which red light Lr is emitted may correspond to a red pixel Pr, a region from which green light Lg is emitted may correspond to a green pixel Pg, and a region from which blue light Lb is emitted may correspond to a blue pixel Pb.

The color panel 2 may include a color-conversion transmission layer and a color layer, the color-conversion transmission layer including a first color converter 40*a*, a second color converter 40*b*, and a transmission portion 40*c*, and the color layer including a first color filter 30*a*, a second color filter 30*b*, and a third color filter 30*c*.

A first color region of the color panel 2 may include the first color converter 40a that overlaps the first color filter 30a, a second color region of the color panel 2 may include the second color converter 40b that overlaps the second color filter 30b, and a third color region of the color panel 2 may include the transmission portion 40c that overlaps the third color filter 30c.

The color panel 2 may include a light-blocking region arranged to surround each of the first to third color regions. The light-blocking region may include a first light-blocking layer 21 on a second substrate 20. The first light-blocking layer 21 may include a plurality of holes formed as a result of portions thereof corresponding to the red pixel Pr, the green pixel Pg, and the blue pixel Pb being removed. The first light-blocking layer 21 may include a material portion arranged in the non-pixel area NPA. The material portion may include various materials that may absorb light.

The light-blocking region may include a second light-blocking layer 22 on the first light-blocking layer 21. The second light-blocking layer 22 may also include a material portion arranged in the non-pixel area NPA. The second light-blocking layer 22 may include various materials that may absorb light. The second light-blocking layer 22 may include a material same as or different from that of the first light-blocking layer 21. The first light-blocking layer 21 and/or the second light-blocking layer 22 may include an opaque inorganic insulating material such as chrome oxide or molybdenum oxide, or include an opaque organic insulating material such as a black resin.

Blue light emitted from the first light-emitting diode LED1 of the light-emitting panel 1 may pass through the first color region. Blue light may be converted and filtered into red light Lr while passing through the color panel 2. The first color converter 40a and the first color filter 30a of the first color region overlap the first light-emitting diode LED1. Blue light Lb emitted from the first light-emitting diode LED1 may be converted at the first color converter 40a and then may pass through the first color filter 30a. The first color converter 40a may convert blue light incident thereto into red light Lr. As shown in FIG. 1C, the first color converter 40a may include a first photosensitive polymer 1151, and first quantum dots 1152 and first scattering particles 1153 dispersed in the first photosensitive polymer 1151.

The first quantum dots 1152 may be excited by blue light Lb and may isotropically emit red light Lr having a wavelength longer than that of the blue light Lb. The first photosensitive polymer 1151 may include an organic material having a light transmission characteristic. The first scattering particles 1153 scatter blue light Lb that is not absorbed in the first quantum dots 1152 and allow more first quantum dots 1152 to be excited, thereby increasing a color conversion efficiency. The first scattering particles 1153 may include, for example, metal oxide such as TiO2 or particles including metal. The first quantum dots 1152 may be one of a Group II-Group VI compound, a Group II-Group V compound, a Group IV-Group VI compound, a Group IV element, a Group IV compound, and a combination thereof.

Red light Lr converted by the first color converter 40a may improve color purity thereof while passing through the first color filter 30a. The first color filter 30a may include pigment or dye of a first color (e.g. a red color).

Blue light emitted from the second light-emitting diode LED2 of the light-emitting panel 1 may pass through the second color region of the color panel 2. Blue light may be converted and filtered into green light Lg while passing through the color panel 2. The second color converter 40b and the second color filter 30b of the second color region may overlap the second light-emitting diode LED2. Blue light Lb emitted from the second light-emitting diode LED2 may be converted at the second color converter 40b and then may pass through the second color filter 30b.

The second color converter 40b may convert blue light Lb incident thereto into green light Lg. The second color converter 40b may overlap the second color filter 30b. As shown in FIG. 1C, the second color converter 40b may include a second photosensitive polymer 1161, and second quantum dots 1162 and second scattering particles 1163 dispersed in the second photosensitive polymer 1161.

The second quantum dots 1162 may be excited by blue light Lb and may isotropically emit green light Lg having a wavelength longer than that of the blue light Lb. The second photosensitive polymer 1161 may include an organic material having a light transmission characteristic.

The second scattering particles 1163 scatter blue light Lb that is not absorbed in the second quantum dots 1162 and allow more second quantum dots 1162 to be excited, thereby increasing a color conversion efficiency. The second scattering particles 1163 may include, for example, metal oxide such as TiO2 or particles including metal. The second quantum dots 1162 may be one of a Group II-Group VI compound, a Group II-Group V compound, a Group IV-Group VI compound, a Group IV element, a Group IV compound, and a combination thereof.

In an embodiment, the first quantum dots 1152 and the second quantum dots 1162 may include the same material. In this case, the size of the first quantum dots 1152 may be greater than the size of the second quantum dots 1162.

Green light Lg converted by the second color converter 40b may improve color purity thereof while passing through the second color filter 30b. The second color filter 30b may include pigment or dye of a second color (e.g. a green color).

Blue light emitted from the third light-emitting diode LED3 of the light-emitting panel 1 may pass through the third color region of the color panel 2. The transmission portion 40c and the third color filter 30c of the third color region may overlap the third light-emitting diode LED3. Blue light Lb emitted from the third light-emitting diode LED3 may pass through the transmission portion 40c without color conversion and be emitted to the outside through the third color filter 30c.

The transmission portion 40c may transmit blue light Lb incident to the transmission portion 40c without conversion. As shown in FIG. 1C, the transmission portion 40c may include a third photosensitive polymer 1171 in which third scattering particles 1173 are dispersed. The third photosensitive polymer 1171 may include an organic material having a light transmission characteristic, for example, a silicon resin, an epoxy resin, and the like and may include the same material as those of the first and second photosensitive polymers 1151 and 1161. The third scattering particles 1173 may scatter and emit blue light Lb and include the same material as those of the first and second scattering particles 1153 and 1163. The third scattering particles 1173 may include, for example, metal oxide such as TiO2 or particles including metal.

Blue light Lb that passes through the transmission portion 40c may improve color purity thereof while passing through the third color filter 30c.

The first to third light-emitting diodes LED1, LED2, and LED3 may include organic light-emitting diodes including an organic material. In another embodiment, the first to third light-emitting diodes LED1, LED2, and LED3 may include inorganic light-emitting diodes including an inorganic material. An inorganic light-emitting diode may include a PN-junction diode including inorganic semiconductor-based materials. When a forward voltage is applied to a PN-junction diode, holes and electrons are injected, energy created due to recombination of holes and electrons is converted to light energy, and light of a present color may be emitted. The inorganic light-emitting diode may have a width of several micrometers to hundreds of micrometers or a width of several nanometers to hundreds of nano meters. In an embodiment, the light-emitting diode may be a light-emitting diode including quantum dots. As described above, an emission layer of the light-emitting diode LED may include an organic material, an inorganic material, quantum dots, an organic material and quantum dots, or an inorganic material and quantum dots.

The display apparatus DV may include mobile phones, televisions, advertisement boards, monitors, tablet personal computers (PC), and notebook computers.

Figure 2:
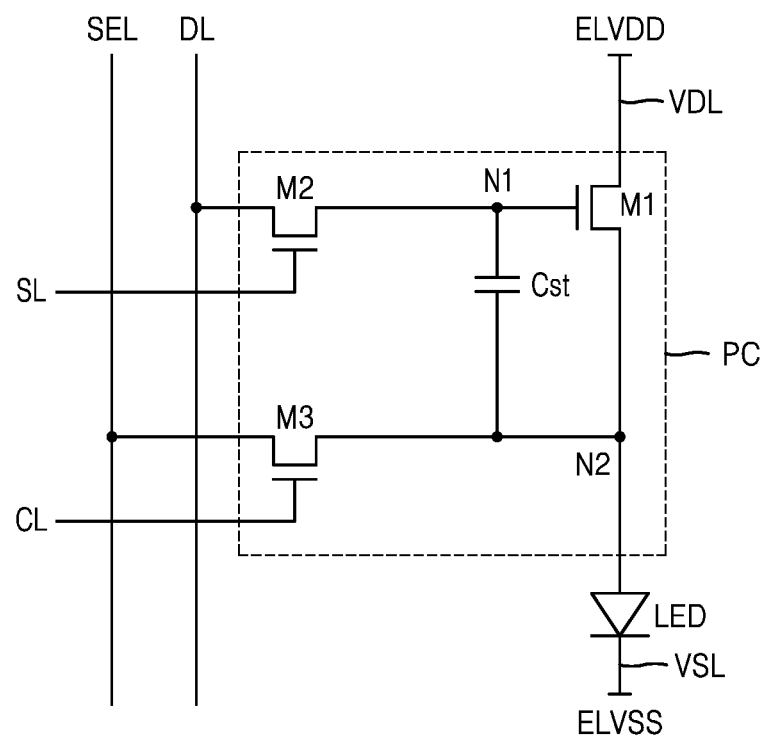
FIG. 2 is an equivalent circuit diagram of a light-emitting diode and a pixel circuit electrically connected to the light-emitting diode, included in a light-emitting panel of a display apparatus according to an embodiment.

FIG. 2 is an equivalent circuit diagram of a light-emitting diode and a pixel circuit PC electrically connected to the light-emitting diode, included in a light-emitting panel of a display apparatus according to an embodiment.

Referring to FIG. 2, a first electrode (e.g., an anode) of the light-emitting diode LED may be connected to the pixel circuit PC, and a second electrode (e.g., a cathode) of the light-emitting diode LED may be connected to a common voltage line VSL providing a common power voltage ELVSS. The light-emitting diode LED may emit light at brightness corresponding to the amount of current supplied from the pixel circuit PC.

The light-emitting diode LED of FIG. 2 may correspond to each of the first to third light-emitting diodes LED1, LED2, and LED3 shown in FIG. 1B, and the pixel circuit PC of FIG. 2 may correspond to each of the first to third pixel circuits PC1, PC2, and PC3 shown above in FIG. 1B.

The pixel circuit PC may control the amount of current flowing from a driving power voltage ELVDD to the common power voltage ELVSS through the light-emitting diode LED according to a data signal. The pixel circuit PC may include a driving transistor M1, a switching transistor M2, a sensing transistor M3, and a storage capacitor Cst.

Each of the driving transistor M1, the switching transistor M2, and the sensing transistor M3 may be an oxide semi-conductor thin-film transistor including a semiconductor layer including an oxide semiconductor, or a silicon semi-conductor thin-film transistor including a semiconductor layer including polycrystalline silicon. A first electrode may be one of a source electrode and a drain electrode, and a second electrode may be the other of the source electrode and the drain electrode depending on the type of a transistor.

The first electrode of the driving transistor M1 may be connected to a driving voltage line VDL configured to supply the driving power voltage ELVDD, and the second electrode may be connected to the first electrode of the light-emitting diode LED. A gate electrode of the driving transistor M1 may be connected to a first node N1. The driving transistor M1 may control the amount of current flowing from the driving power voltage ELVDD to the light-emitting diode LED according to the voltage of the first node N1.

The switching transistor M2 may be a switching transistor. A first electrode of the switching transistor M2 may be connected to a data line DL, and a second electrode of the switching transistor M2 may be connected to the first node N1. A gate electrode of the switching transistor M2 may be connected to a scan line SL. The switching transistor M2 may be turned on when a scan signal is supplied through the scan line SL and may electrically connect the data line DL to the first node N1.

The sensing transistor M3 may be an initialization transistor and/or a sensing transistor. A first electrode of the sensing transistor M3 may be connected to a second node N2, and a second electrode of the sensing transistor M3 may be connected to a sensing line SEL. A gate electrode of the sensing transistor M3 may be connected to a control line CL.

The storage capacitor Cst may be connected between the first node N1 and the second node N2. As an example, a first capacitor electrode of the storage capacitor Cst may be connected to the gate electrode of the driving transistor M1, and a second capacitor electrode of the storage capacitor Cst may be connected to the first electrode of the light-emitting diode LED.

In an embodiment, a method of driving the pixel circuit PC during an image display section is described below.

During a first section in which the switching transistor M2 receives an on-voltage of the scan line SL, the switching transistor M2 is turned on according to an on-voltage of a scan signal. When the switching transistor M2 is turned on, a data voltage of the data line DL is applied to the gate electrode of the driving transistor M1 connected to the first node N1 and is stored in the storage capacitor Cst.

The driving transistor M1 is turned on based on a data voltage, and a driving current flows through the first electrode (e.g., an anode) of the light-emitting diode LED based on the driving power voltage ELVDD. The light-emitting diode LED may display an image by emitting light according to the driving current corresponding to the data voltage.

During a second section in which the sensing transistor M3 receives an on-voltage of the control line CL, the sensing transistor M3 is turned on according to the on-voltage of a control signal. An initialization voltage of the sensing line SEL is applied to the second node N2, for example, the first electrode of the light-emitting diode LED. Accordingly, the first electrode of the light-emitting diode LED may be initialized.

A method of driving the pixel circuit PC during a sensing section is described below.

The switching transistor M2 is turned off according to an off-voltage of a scan signal, and the sensing transistor M3 is turned off according to an off-voltage of a control signal. A sensing signal applied to the second node N2 may be provided to a controller (or a sensing portion) through the sensing line SEL, the second node N2 being connected to the electrode of the driving transistor M1 and the first electrode of the light-emitting diode LED. The controller may generate sensing data, which is digital data, by using a sensing signal and compensate for and correct image data by using the sensing data.

Though it is shown in FIG. 2 that the driving transistor M1, the switching transistor M2, and the sensing transistor M3 include n-channel metal oxide semiconductor (NMOS), the embodiment is not limited thereto. As an example, at least one of the driving transistor M1, the switching transistor M2, and the sensing transistor M3 may include a p-channel metal oxide semiconductor (PMOS).

Though FIG. 2 shows three transistors, the embodiment is not limited thereto. The pixel circuit PC may include four or more transistors.

Figure 3:
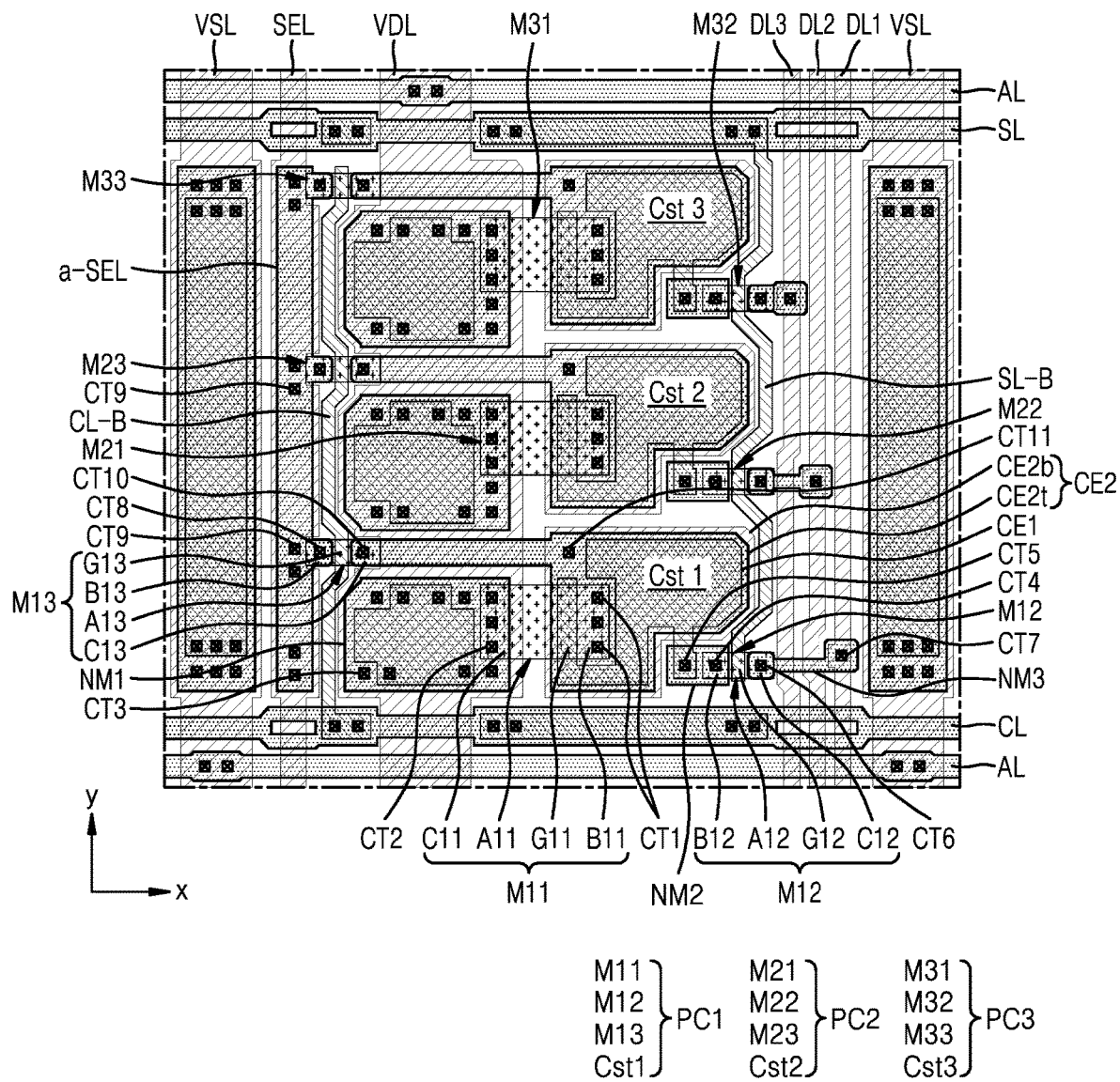
FIG. 3 is a plan view of pixel circuits of a light-emitting panel according to an embodiment.
Figure 4:
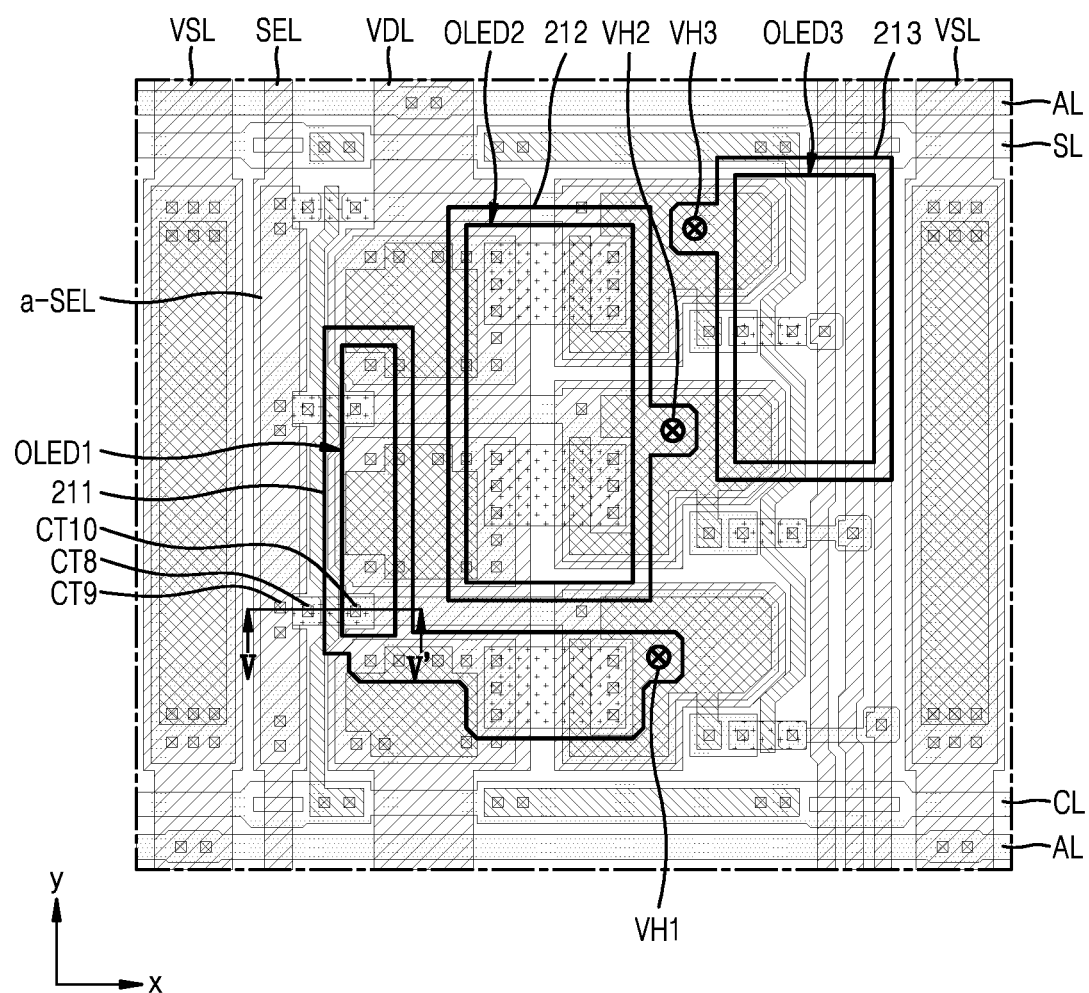
FIG. 4 is a plan view of light-emitting diodes arranged on pixel circuits of FIG. 3.

FIG. 3 is a plan view of pixel circuits of a light-emitting panel according to an embodiment, and FIG. 4 is a plan view of light-emitting diodes arranged on pixel circuits of FIG. 3. In an embodiment, FIG. 4 shows the case where a light-emitting diode is an organic light-emitting diode.

Referring to FIG. 3, the scan line SL and the control line CL may extend in an x-direction, and a plurality of data lines, for example, first to third data lines DL1, DL2, and DL3 may extend in a y-direction crossing the x-direction. The sensing line SEL, the driving voltage line VDL, and the common voltage line VSL may extend in the y-direction.

In an embodiment, two common voltage lines VSL that are adjacent to each other may be apart from each other. The first to third data lines DL1, DL2, and DL3, the sensing line SEL, and the driving voltage line VDL may be arranged between the two common voltage lines VSL that are adjacent to each other. The sensing line SEL and the driving voltage line VDL may be adjacent to each other and adjacent to one of the common voltage lines VSL. The first to third data lines DL1, DL2, and DL3 may be adjacent to each other and adjacent to the common voltage lines VSL. As an example, the sensing line SEL and the driving voltage line VDL may be arranged on one side (e.g., the left side) of first to third storage capacitors Cst1, Cst2, and Cst3. The first to third data lines DL1, DL2, and DL3 may be arranged on the other side (e.g., the right side) of the first to third storage capacitors Cst1, Cst2, and Cst3. Through this structure, the space of the display panel may be efficiently used.

Auxiliary lines AL may extend, for example, in the x-direction to cross the common voltage line VSL and the driving voltage line VDL. The auxiliary lines AL may be apart from each other with the first to third storage capacitors Cst1, Cst2, and Cst3 therebetween. As an example, one of the auxiliary lines AL may be adjacent to the scan line SL, and another may be adjacent to the control line CL. One of the auxiliary lines AL may be electrically connected to the common voltage line VSL. In an embodiment, as shown in FIG. 4, one of the auxiliary lines AL may be electrically connected to the common voltage line VSL, and another may not be electrically connected to the common voltage line VSL. In another embodiment, one of the auxiliary lines AL that are adjacent to each other may be electrically connected to the common voltage line VSL, and another may be electrically connected to the driving voltage line VDL.

The display panel may have a structure in which the structure shown in FIG. 3 is repeated in the x-direction and the y-direction, and accordingly, the plurality of auxiliary lines AL and the plurality of common voltage lines VSL provided to the display panel may constitute a mesh structure in a plan view. Likewise, the plurality of auxiliary lines AL and the plurality of driving voltage lines VDL electrically connected to each other may constitute a mesh structure in a plan view.

The transistors and the storage capacitors may be arranged in an approximately quadrangular space surrounded by the common voltage lines VSL adjacent to each other and the auxiliary lines AL adjacent to each other. The transistors and the storage capacitors may be respectively electrically connected to corresponding light-emitting diodes. With regard to this, it is shown in FIG. 4 that first electrodes 211, 212, and 213 of first to third organic light-emitting diodes OLED1, OLED2, and OLED3 are respectively electrically connected to the corresponding pixel circuits.

The first electrode 211 of the first organic light-emitting diode OLED1 may be electrically connected to the first pixel circuit PC1. As shown in FIG. 3, the first pixel circuit PC1 may include a first driving transistor M11, a first switching transistor M12, a first sensing transistor M13, and the first storage capacitor Cst1.

The first electrode 212 of the second organic light-emitting diode OLED2 may be electrically connected to the second pixel circuit PC2. The second pixel circuit PC2 may include a second driving transistor M21, a second switching transistor M22, a second sensing transistor M23, and the second storage capacitor Cst2.

The first electrode 213 of the third organic light-emitting diode OLED3 may be electrically connected to the third pixel circuit PC3. The third pixel circuit PC3 may include a third driving transistor M31, a third switching transistor M32, a third sensing transistor M33, and the third storage capacitor Cst3.

The first to third storage capacitors Cst1, Cst2, and Cst3 may be arranged in one direction, for example, the y-direction. The first storage capacitor Cst1 may be arranged relatively closest to the control line CL, the third storage capacitor Cst3 may be arranged relatively closest to the scan line SL, and the second storage capacitor Cst2 may be arranged between the first storage capacitor Cst1 and the third storage capacitor Cst3.

The first driving transistor M11 may include a first driving semiconductor layer A11 and a first driving gate electrode G11. The first driving semiconductor layer A11 may include an oxide semiconductor or a silicon-based semiconductor. The first driving semiconductor layer A11 may include a first low-resistance region B11 and a second low-resistance region C11. A first channel region may be arranged between the first low-resistance region B11 and the second low-resistance region C11. The first low-resistance region B11 and the second low-resistance region C11 are regions having a resistance less than that of the first channel region and may be formed through a process of doping impurities or a process of making conductive. The first driving gate electrode G11 may overlap the first channel region of the first driving semiconductor layer A11. One of the first low-resistance region B11 and the second low-resistance region C11 may correspond to a source region, and the other may correspond to a drain region.

One of the first low-resistance region B11 and the second low-resistance region C11 of the first driving semiconductor layer A11 may be connected to the first storage capacitor Cst1, and the other may be connected to the driving voltage line VDL. As an example, the first low-resistance region B11 may be connected to a portion (e.g., a second sub-electrode CE2t of a second storage capacitor electrode CE2) of the second capacitor electrode CE2 of the first storage capacitor Cst1 through a first contact hole CT1. The second low-resistance region C11 may be connected to a first connector NM1 through a second contact hole CT2, and the first connector NM1 may be connected to the driving voltage line VDL through a third contact hole CT3. The second low-resistance region C11 may be electrically connected to the driving voltage line VDL through the first connector NM1.

The first switching transistor M12 may include a first switching semiconductor layer A12 and a first switching gate electrode G12. The first switching semiconductor layer A12 may include an oxide semiconductor or a silicon-based semiconductor. The first switching semiconductor layer A12 may include a first low-resistance region B12 and a second low-resistance region C12. A second channel region may be arranged between the first low-resistance region B12 and the second low-resistance region C12. The first switching gate electrode G12 may overlap the second channel region of the first switching semiconductor layer A12. The first switching gate electrode G12 may correspond to a portion of the scan line SL, for example, a portion of a branch (hereinafter referred to as a first branch SL-B) extending in a direction crossing the scan line SL.

The scan line SL may include gate electrodes of first to third switching transistors M12, M22, and M32. As an example, the scan line SL may include the first branch SL-B extending in the y-direction. Portions of the first branch SL-B may correspond to the gate electrodes of first to third switching transistors M12, M22, and M32. The first branch SL-B may extend between a group of the first to third storage capacitors Cst1, Cst2, and Cst3, and a group of the first to third data lines DL1, DL2, and DL3.

One of the first low-resistance region B12 and the second low-resistance region C12 of the first switching semiconductor layer A12 may be electrically connected to the first data line DL1, and the other may be electrically connected to the first storage capacitor Cst1. As an example, the first low-resistance region B12 may be connected to a second connector NM2 through a fourth contact hole CT4, and the second connector NM2 may be connected to a first capacitor electrode CE1 of the first storage capacitor Cst1 through a fifth contact hole CT5. Accordingly, the first low-resistance region B12 may be electrically connected to the first capacitor electrode CE1 of the first storage capacitor Cst1 through the second connector NM2. The second low-resistance region C12 may be connected to a third connector NM3 through a sixth contact hole CT6, and the third connector NM3 may be connected to the first data line DL1 through a seventh contact hole CT7. The second low-resistance region C12 may be connected to the first data line DL1 through the third connector NM3.

The first sensing transistor M13 may include a first sensing semiconductor layer A13 and a first sensing gate electrode G13. The first sensing semiconductor layer A13 may include an oxide semiconductor or a silicon-based semiconductor. The first sensing semiconductor layer A13 may include a first low-resistance region B13 and a second low-resistance region C13. A third channel region may be arranged between the first low-resistance region B13 and the second low-resistance region C13. The first sensing gate electrode G13 may overlap the third channel region of the first sensing semiconductor layer A13.

The control line CL may include gate electrodes of first to third sensing transistors M13, M23, and M33. As an example, the control line CL may include a branch (thereinafter referred to as a second branch CL-B) extending in the y-direction. Portions of the second branch CL-B may correspond to the gate electrodes of the first to third sensing transistors M13, M23, and M33. The second branch CL-B may extend between the driving voltage line VDL and the sensing line SEL.

One of the first low-resistance region B13 and the second low-resistance region C13 of the first sensing semiconductor layer A13 may be electrically connected to the sensing line SEL, and the other may be electrically connected to the first storage capacitor Cst1. As an example, the first low-resistance region B13 may be connected to an auxiliary sensing line a-SEL through an eighth contact hole CT8, and the auxiliary sensing line a-SEL may be connected to the sensing line SEL through a ninth contact hole CT9. Accordingly, the first low-resistance region B13 may be electrically connected to the sensing line SEL through the auxiliary sensing line a-SEL. The auxiliary sensing line a-SEL may extending in an extension direction (the y-direction) of the sensing line SEL while overlapping the sensing line SEL. In a plan view, the auxiliary sensing line a-SEL may be arranged between the scan line SL and the control line CL and may have a length less than a separation distance (a separation distance in the y-direction) between the scan line SL and the control line CL. The second low-resistance region C13 may be electrically connected to a portion of the second capacitor electrode CE2 of the first storage capacitor Cst1, for example, the second sub-electrode CE2t of the second capacitor electrode CE2 through a tenth contact hole CT10.

The first storage capacitor Cst1 may include at least two electrodes. In an embodiment, the first storage capacitor Cst1 may include the first capacitor electrode CE1 and the second capacitor electrode CE2.

The first capacitor electrode CE1 may be formed as one body with the first driving gate electrode G11. In other words, a portion of the first capacitor electrode CE1 may include the first driving gate electrode G11.

The second capacitor electrode CE2 may include a first sub-electrode CE2b and a second sub-electrode CE2t, the first sub-electrode CE2b being under the first capacitor electrode CE1, and the second sub-electrode CE2t being on the first capacitor electrode CE1. The first sub-electrode CE2b may be connected to the second sub-electrode CE2t through an eleventh contact hole CT11.

The specific structures and materials of the second driving transistor M21 and the third driving transistor M31 are the same as those of the first driving transistor M11 described above. The second switching transistor M22 and the third switching transistor M32 are the same as the first switching transistor M12 described above except that the second switching transistor M22 and the third switching transistor M32 are respectively connected to the second data line DL2 and the third data line DL3. The specific structures and materials of the second sensing transistor M23 and the third sensing transistor M33 are the same as those of the first sensing transistor M13 described above. The structure of the second storage capacitor Cst2 and the third storage capacitor Cst3 are the same as that of the first storage capacitor Cst1 described above.

The first organic light-emitting diode OLED1 may be electrically connected to the first pixel circuit through a first via hole VH1 as shown in FIG. 4. As an example, the first electrode 211 of the first organic light-emitting diode OLED1 may be connected to the second sub-electrode CE2t (see FIG. 3) of the first storage capacitor Cst1 through the first via hole VH1.

The second organic light-emitting diode OLED2 may be electrically connected to the second pixel circuit through a second via hole VH2 as shown in FIG. 4. As an example, the first electrode 212 of the second organic light-emitting diode OLED2 may be connected to the second sub-electrode of the second storage capacitor Cst2 through the second via hole VH2.

The third organic light-emitting diode OLED3 may be electrically connected to the third pixel circuit through a third via hole VH3 as shown in FIG. 4. As an example, the first electrode 213 of the third organic light-emitting diode OLED3 may be connected to the second sub-electrode of the third storage capacitor Cst3 through the third via hole VH3.

As shown in FIGS. 3 and 4, the first electrodes 211, 212, and 213 of the first to third organic light-emitting diodes OLED1, OLED2, and OLED3 may overlap portions of the elements therebelow, for example, the lines, the storage capacitors, and/or the transistors and may not overlap the sensing line SEL and the auxiliary sensing line a-SEL electrically connected to the sensing line SEL. With regard to this, it is shown in FIG. 4 that the first electrode 211 of the first organic light-emitting diode OLED1 overlaps a portion of the first sensing transistor M13, a portion of the second sensing transistor M23, and a portion of the driving voltage line VDL, but does not overlap the sensing line SEL and the auxiliary sensing line a-SEL.

Figure 5:
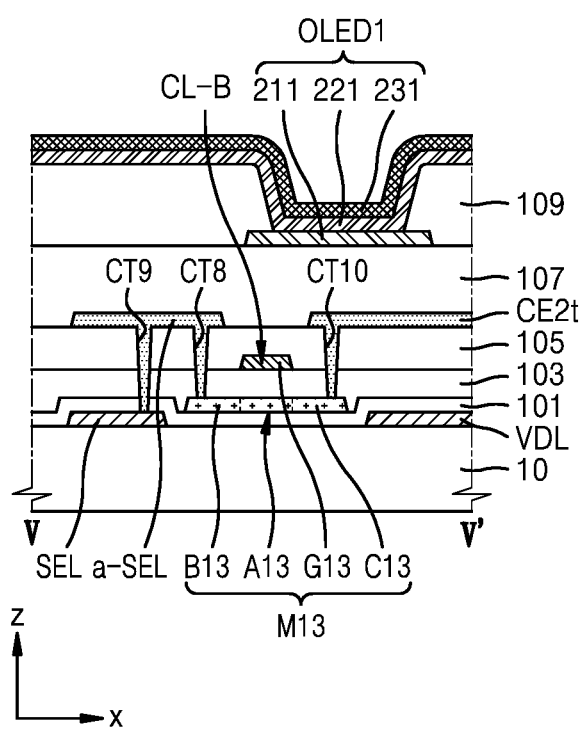
FIG. 5 is a cross-sectional view of a light-emitting diode taken along line V-V' of FIG. 4.

FIG. 5 is a cross-sectional view of the light-emitting diode taken along line V-V' of FIG. 4.

The sensing line SEL may be arranged on the first substrate 10, and the first substrate 10 may include glass or a resin material. Glass may include transparent glass including $SiO_2$ as a main component. The resin material may include a polymer resin such as polyethersulfone, polyacrylate, polyetherimide, polyethylene naphthalate, polyethylene terephthalate, polyphenylene sulfide, polyarylate, polyimide, polycarbonate, cellulose tri acetate, and cellulose acetate propionate. In the case where the first substrate 10 includes the polymer resin, the first substrate 10 may be flexible, rollable, and bendable.

The sensing line SEL may include metal such as molybdenum (Mo), copper (Cu), and titanium (Ti). The sensing line SEL may be arranged directly on the first substrate 10 and may directly contact the first substrate 10. Alternatively, an insulating layer may be arranged between the sensing line SEL and the first substrate 10.

A buffer layer 101 (a first insulating layer) may be arranged on the sensing line SEL, and a semiconductor layer may be arranged on the buffer layer 101. With regard to this, it is shown in FIG. 5 that a first sensing semiconductor layer A13 of the first sensing transistor M13 is arranged on the buffer layer 101. The semiconductor layers of all of the other transistors may be arranged on the buffer layer 101.

The buffer layer 101 may prevent impurities from penetrating into the semiconductor layers. The buffer layer 101 may include an inorganic insulating material such as silicon nitride, silicon oxide, and/or silicon oxynitride.

A gate insulating layer 103 (a second insulating layer) is arranged on the semiconductor layer. With regard to this, it is shown in FIG. 5 that the gate insulating layer 103 is arranged on the first sensing semiconductor layer A13. The gate insulating layer 103 may include an inorganic insulating material such as silicon nitride, silicon oxide, and/or silicon oxynitride, or include an organic insulating material. The gate insulating layer 103 may include a single-layered structure or a multi-layered structure including the above materials.

A gate electrode may overlap a channel region of a corresponding semiconductor layer with the gate insulating layer 103 therebetween. With regard to this, it is shown in FIG. 5 that the first sensing gate electrode G13 overlaps the channel region of the first sensing semiconductor layer A13 with the gate insulating layer 103 therebetween. The first sensing semiconductor layer A13 may include the channel region, the first low-resistance region B13, and the second low-resistance region C13, the channel region overlapping the first sensing gate electrode G13, and the first low-resistance region B13 and the second low-resistance region C13 being arranged on two opposite sides of the channel region. The first sensing gate electrode G13 may include at least one of molybdenum (Mo), copper (Cu), and titanium (Ti) and have a single-layered structure or a multi-layered structure including the above material.

An interlayer insulating layer 105 (a third insulating layer) may be arranged on the gate insulating layer. With regard to this, FIG. 5 shows an interlayer insulating layer 105 on the first sensing gate electrode G13. The interlayer insulating layer 105 may include an inorganic insulating material such as silicon nitride, silicon oxide, and/or silicon oxynitride, or include an organic insulating material.

The auxiliary sensing line a-SEL may be arranged on the interlayer insulating layer 105 and electrically connected to the sensing line SEL through a contact hole passing through the interlayer insulating layer 105. As an example, the auxiliary sensing line a-SEL may be electrically connected to the sensing line SEL through the ninth contact hole CT9 passing through the buffer layer 101, the gate insulating layer 103, and the interlayer insulating layer 105. Because the auxiliary sensing line a-SEL has a preset length and is electrically connected to the sensing line SEL, a local voltage drop due to a resistance of the sensing line SEL may be prevented. A portion of the auxiliary sensing line a-SEL may be electrically connected to the sensing semiconductor layer through the eighth contact hole CT8 passing through the gate insulating layer 103 and the interlayer insulating layer 105. With regard to this, it is shown that the auxiliary sensing line a-SEL is connected to the first low-resistance region B13 of the first sensing semiconductor layer A13 through the eighth contact hole CT8. The second low-resistance region C13 of the first sensing semiconductor layer A13 may be electrically connected to the second capacitor electrode, for example, the second sub-electrode CE2t through the tenth contact hole CT10.

A via insulating layer 107 may be arranged on that the auxiliary sensing line a-SEL. The via insulating layer 107 may include an organic insulating material and/or an inorganic insulating material. The organic insulating material may include, for example, a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The first electrode of the light-emitting diode may be arranged on the via insulating layer 107. With regard to this, it is shown in FIG. 5 that the first electrode 211 of the first organic light-emitting diode OLED1 is arranged on the via insulating layer 107.

A bank layer 109 is arranged on the first electrode 211, the bank layer 109 including an opening that exposes a portion of the first electrode 211. An emission layer 221 and a second electrode 231 may be arranged to overlap the first electrode 211 through the opening of the bank layer 109. The first electrode 211 may include a transparent conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the first electrode 211 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In another embodiment, the first electrode 211 may further include a layer on/under the reflective layer, the layer including ITO, IZO, ZnO, or $In_2O_3$. In an embodiment, the first electrode 211 may have a three-layered structure of an ITO layer, an Ag layer, and an ITO layer. Though FIG. 5 describes the first electrode 211 of the first organic light-emitting diode OLED1, the first electrodes 212 and 213 of the second and third organic light-emitting diodes OLED2 and OLED3 may be arranged in the same layer as the first electrode 211 of the first organic light-emitting diode OLED1 and may include the same material as that of the first electrode 211 of the first organic light-emitting diode OLED1.

The emission layer 221 may include a polymer organic material or a low-molecular weight organic material that emits blue light. The emission layer 221 may be formed to cover the first substrate 10 entirely. As an example, the emission layer 221 may be formed as one body to entirely cover the first to third organic light-emitting diodes OLED1, OLED2, and OLED3 described above with reference to FIG. 4. The second electrode 231 may be also formed to cover the first substrate 10 entirely.

The second electrode 231 may be a semi-transmissive electrode or a transmissive electrode. The second electrode 231 may be a semi-transmissive electrode including an ultra thin-film metal including magnesium (Mg), silver (Ag), aluminum (Al), platinum (Pt), palladium (Pd), gold (Au), nickel (Ni), neodymium (Nd), iridium (Ir), chrome (Cr), or a compound thereof. The second electrode 231 may include a transparent conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

Referring to FIGS. 4 and 5, the first electrodes 211, 212, and 213 of the first to third organic light-emitting diodes OLED1, OLED2, and OLED3 do not overlap the sensing line SEL and the auxiliary sensing line a-SEL electrically connected to the sensing line SEL.

As a comparative example, in the case where the first to third organic light-emitting diodes OLED1, OLED2, and OLED3 overlap the sensing line SEL and the auxiliary sensing line a-SEL electrically connected to the sensing line SEL, a parasitic capacitance may occur between the auxiliary sensing line a-SEL and the first electrode of one of the first to third organic light-emitting diodes OLED1, OLED2, and OLED3. The parasitic capacitance may influence brightness of other pixels. In addition, the parasitic capacitance changes a current value sensed during a sensing operation that uses the sensing transistor (e.g., the first to third sensing transistors M13, M23, and M33), and thus, makes accurate sensing impossible. In contrast, according to an embodiment, as shown in FIGS. 4 and 5, the first to third organic light-emitting diodes OLED1, OLED2, and OLED3 are designed not to overlap the sensing line SEL and the auxiliary sensing line a-SEL electrically connected to the sensing line SEL, and thus, the above issue may be prevented.

Figure 6:
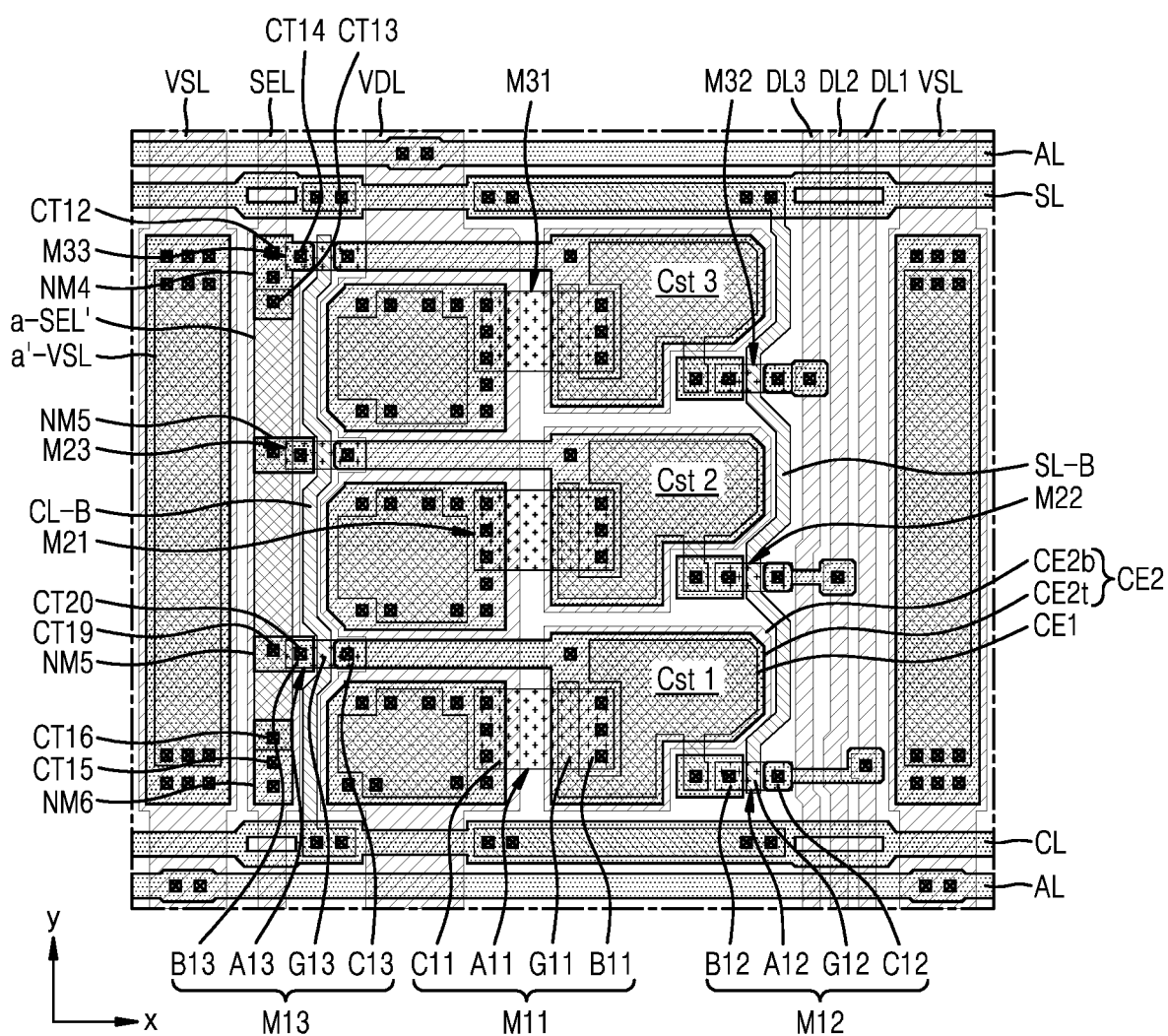
FIG. 6 is a plan view of pixel circuits of a light-emitting panel according to another embodiment.
Figure 7:
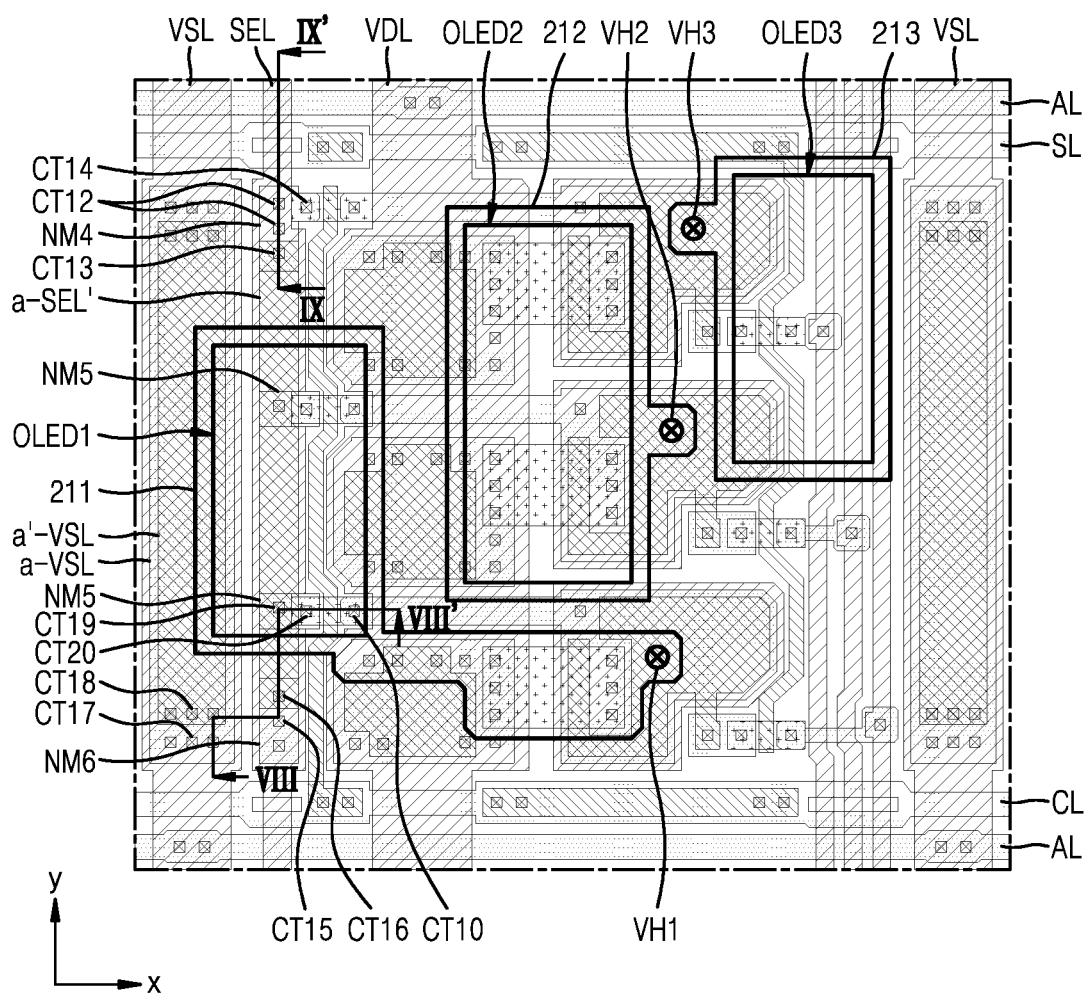
FIG. 7 is a plan view of light-emitting diodes arranged on pixel circuits of FIG. 6.
Figure 8:
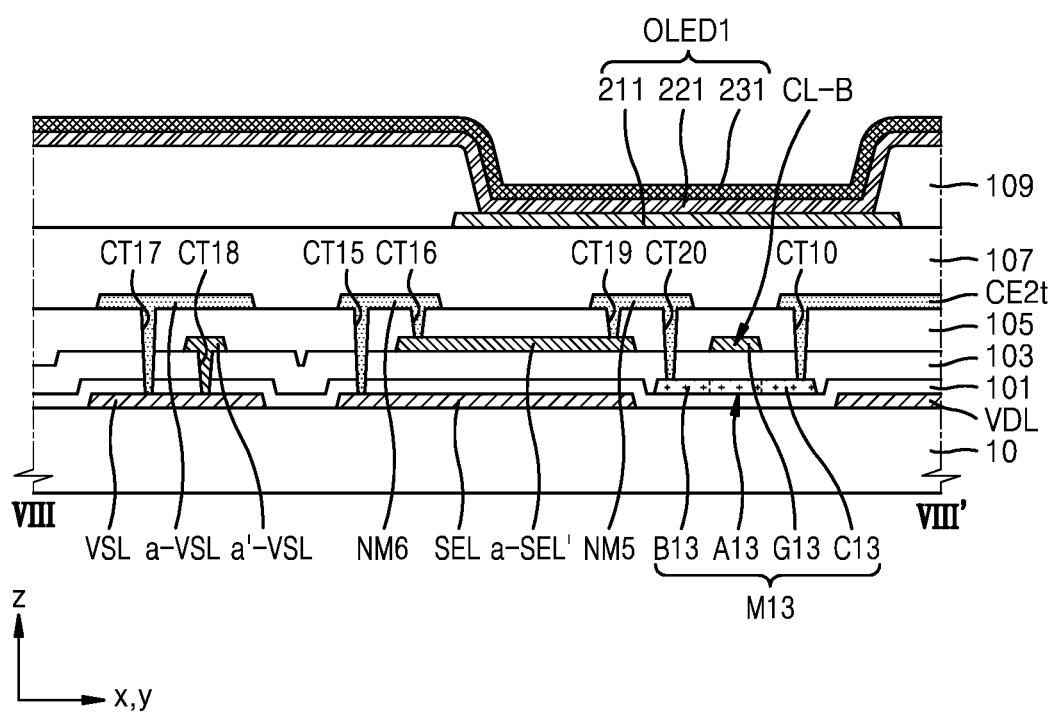
FIG. 8 is a cross-sectional view of a light-emitting diode taken along line VIII-VIII' of FIG. 7.
Figure 9:
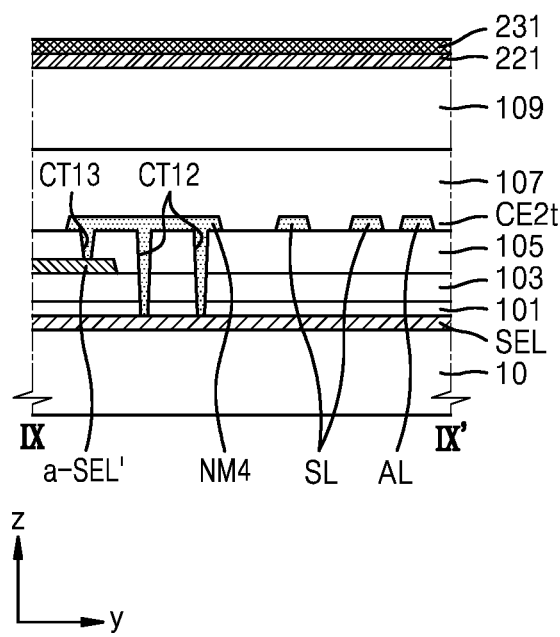
FIG. 9 is a cross-sectional view taken along line IX-IX' of FIG. 7.

FIG. 6 is a plan view of pixel circuits of a light-emitting panel according to another embodiment, FIG. 7 is a plan view of light-emitting diodes arranged on pixel circuits of FIG. 6, FIG. 8 is a cross-sectional view of the light-emitting diode taken along line VIII-VIII' of FIG. 7, and FIG. 9 is a cross-sectional view of the light-emitting diode taken along line IX-IX' of FIG. 7. It is shown in FIG. 7 that the light-emitting diode is an organic light-emitting diode. With regard to this, FIG. 7 shows the first to third organic light-emitting diodes OLED1, OLED2, and OLED3 electrically connected to corresponding pixel circuits through the first to third via holes VH1, VH2, and VH3.

Referring to FIG. 6, the light-emitting panel may include the scan line SL, the control line CL, and the auxiliary line AL each extending in the x-direction and include the first to third data lines DL1, DL2, and DL3, the sensing line SEL, the driving voltage line VDL, and the common voltage line VSL each extending in the y-direction.

Transistors and the storage capacitors corresponding to the first to third pixel circuits may be arranged between two common voltage lines VSL that are adjacent to each other. With regard to this, FIG. 6 shows the first to third driving transistors M11, M21, and M31, the first to third switching transistors M12, M22, and M32, and the first to third sensing transistors M13, M23, and M33, and the first to third storage capacitors Cst1, Cst2, and Cst3.

According to the embodiment described above with reference to FIG. 3, it is shown that the auxiliary sensing line a-SEL electrically connected to the sensing line SEL overlaps the sensing line SEL and is arranged on the gate electrode, for example, the first sensing gate electrode G13, the embodiment is not limited thereto. An auxiliary sensing line a-SEL' may be arranged in the same layer as the gate electrode of the transistors and/or the first capacitor electrode and may include the same material as that of the gate electrode of the transistors and/or the first capacitor electrode. With regard to this, it is shown in FIGS. 6 to 8 that the auxiliary sensing line a-SEL' is arranged in the same layer as the first branch SL-B, the second branch CL-B, and the first capacitor electrode CE1 and includes the same material as that of the first branch SL-B, the second branch CL-B, and the first capacitor electrode CE1.

The auxiliary sensing line a-SEL' may extend in the same direction as a direction in which the sensing line SEL extends. The auxiliary sensing line a-SEL' may extend to have a length less than a separation distance (e.g., a separation distance in the y-direction) between the scan line SL and the control line CL.

The auxiliary sensing line a-SEL' may be electrically connected to the sensing line SEL arranged below the auxiliary sensing line a-SEL' through a connector. With regard to this, it is shown in FIG. 6 that the auxiliary sensing line a-SEL' is electrically connected to the sensing line SEL through a fourth connector NM4 and a sixth connector NM6.

The fourth connector NM4 may be arranged on the sensing line SEL and the auxiliary sensing line a-SEL' and connected to the sensing line SEL through a twelfth contact hole CT12 and connected to the auxiliary sensing line a-SEL' through a thirteenth contact hole CT13. The sixth connector NM6 may be arranged on the sensing line SEL and the auxiliary sensing line a-SEL' and connected to the sensing line SEL through a fifteenth contact hole CT15 and connected to the auxiliary sensing line a-SEL' through a sixteenth contact hole CT16.

The fourth connector NM4 may electrically connect the sensing line SEL to the sensing transistor, for example, the third sensing transistor M33. The fourth connector NM4 may be connected to the sensing semiconductor layer of the third sensing transistor M33 through a fourteenth contact hole CT14. Other sensing transistors, for example, the first and second sensing transistors M13 and M23 may be electrically connected to the sensing line SEL through a fifth connector NM5. For example, the fifth connector NM5 may be connected to the auxiliary sensing line a-SEL' connected to the sensing line SEL through a nineteenth contact hole CT19, and be connected to the low-resistance region (e.g., the low-resistance region B13 of FIG. 8) of the first and second sensing transistors M13 and M23 through a twentieth contact hole CT20. Referring to FIG. 8, one of the low-resistance regions B13 and C13 of the first sensing transistor M13 may be connected to the fifth connector NM5 through the ninth and twentieth contact holes CT19 and CT20, and the other may be connected to the second sub-electrode CE2t through the tenth contact hole CT10.

Though it is shown in FIG. 6 that the length of the auxiliary sensing line a-SEL' in the y-direction is less than the separation distance between the scan line SL and the control line CL and thus the auxiliary sensing line a-SEL' does not overlap the scan line SL and the control line CL, the embodiment is not limited thereto. Because the auxiliary sensing line a-SEL' is arranged in a layer different from the scan line SL and the control line CL, a portion of the auxiliary sensing line a-SEL' may extend to overlap one of the scan line SL and the control line CL. As an example, a portion of the auxiliary sensing line a-SEL' shown in FIG. 6 may extend below the control line CL to overlap the control line CL, and in this case, the sixth connector NM6 may be omitted in some implementations of this embodiment.

As shown in FIGS. 6 and 8 below, in the case where the auxiliary sensing line a-SEL' is arranged in the same layer as the gate electrode and/or the first capacitor electrode, the first electrode of the organic light-emitting diode may overlap the auxiliary sensing line a-SEL' and the sensing line SEL as shown in FIGS. 7 and 8. With regard to this, it is shown in FIG. 7 that the first electrode 211 of the first organic light-emitting diode OLED1 overlaps the auxiliary sensing line a-SEL' and the sensing line SEL. The first electrode 211 of the first organic light-emitting diode OLED1 may overlap the first sensing transistor M13, the second sensing transistor M23, and the driving voltage line VDL. As an example, the first electrode 211 of the first organic light-emitting diode OLED1 may overlap the first sensing semiconductor layer A13 and the first sensing gate electrode G13 of the first sensing transistor M13, overlap the second sensing semiconductor layer and the second sensing gate electrode of the second sensing transistor M23, and overlap the driving voltage line VDL.

Referring to FIG. 8, the common voltage line VSL, the sensing line SEL, and the driving voltage line VDL may be arranged on the first substrate 10. The buffer layer 101 may be arranged on the common voltage line VSL, the sensing line SEL, and the driving voltage line VDL. The first to third data lines DL1, DL2, and DL3 shown in FIG. 6 may be also arranged on the same layer as the sensing line SEL, for example, on the first substrate 10.

An auxiliary common voltage line may be arranged on the common voltage line VSL, the auxiliary common voltage line being electrically connected to the common voltage line VSL. With regard to this, FIGS. 7 and 8 show a first auxiliary common voltage line a-VSL and a second auxiliary common voltage line a'-VSL. The first auxiliary common voltage line a-VSL may be arranged on the interlayer insulating layer 105 and electrically connected to the common voltage line VSL through a seventeenth contact hole CT17 passing through the buffer layer 101, the gate insulating layer 103, and the interlayer insulating layer 105. The second auxiliary common voltage line a'-VSL may be arranged on the gate insulating layer 103 and electrically connected to the common voltage line VSL through an eighteenth contact hole CT18 passing through the buffer layer 101 and the gate insulating layer 103.

The auxiliary sensing line a-SEL' may be arranged in the same layer as the gate electrode, for example, the first sensing gate electrode G13. As an example, the auxiliary sensing line a-SEL' may be arranged on the gate insulating layer 103. The auxiliary sensing line a-SEL' may overlap the sensing line SEL and be electrically connected to the sensing line SEL through the sixth connector NM6 arranged over the auxiliary sensing line a-SEL' and the sensing line SEL. The sixth connector NM6 may be connected to the sensing line SEL through a fifteenth contact hole CNT15 and connected to the auxiliary sensing line a-SEL' through a sixteenth contact hole CNT16.

The semiconductor layer may be arranged on the buffer layer 101. With regard to this, it is shown in FIG. 8 that the first sensing semiconductor layer A13 of the first sensing transistor M13 is arranged on the buffer layer 101. The semiconductor layers of the other transistors are arranged on the buffer layer 101 as described above.

The first sensing semiconductor layer A13 includes the channel region, the first low-resistance region B13, and the second low-resistance region C13, the channel region overlapping first sensing gate electrode G13 (a portion of the second branch CL-B of the control line) with the gate insulating layer 103 therebetween, and the first low-resistance region B13 and the second low-resistance region C13 being on two opposite sides of the channel region. The first low-resistance region B13 may be electrically connected to the sensing line SEL. Like the sixth connector NM6, the fifth connector NM5 may be arranged on the interlayer insulating layer 105, connected to the auxiliary sensing line a-SEL' through the nineteenth contact hole CT19 of the interlayer insulating layer 105, and connected to the first low-resistance region B13 through the twentieth contact hole CT20 passing through the interlayer insulating layer 105 and the gate insulating layer 103. The second low-resistance region C13 may be connected to the electrode of the first storage capacitor Cst1 (see FIG. 6), for example, to the second sub-electrode CE2t on the interlayer insulating layer 105.

The first electrode 211 of the first organic light-emitting diode OLED1 may be arranged on the via insulating layer 107 and may overlap the sensing line SEL and the auxiliary sensing line a-SEL' as shown in FIGS. 7 and 8. The first organic light-emitting diode OLED1 may include the emission layer 221 and the second electrode 231 on the first electrode 211.

According to the embodiment described with reference to FIGS. 3 to 5, because the auxiliary sensing line a-SEL is arranged on the interlayer insulating layer 105, in the case where the first electrode of the organic light-emitting diode overlaps the auxiliary sensing line a-SEL, a parasitic capacitance occurs therebetween. In contrast, according to the embodiment shown in FIG. 8, because the auxiliary sensing line a-SEL' is formed on the gate insulating layer 103, a vertical distance (a distance in a z-direction) between the first electrode 211 and the auxiliary sensing line a-SEL' may be sufficiently secure, and thus, the occurrence of a parasitic capacitance between the first electrode 211 and the auxiliary sensing line a-SEL' may be reduced. Accordingly, the first electrode 211 of the first organic light-emitting diode OLED1 may be arranged without limitation in the positions of the sensing line SEL and the auxiliary sensing line a-SEL'.

In the case where the display apparatus includes a relatively large display area, a resistance thereof increases according to the length of the sensing line SEL crossing the display area. However, as described above, a voltage drop due to the length increase of the sensing line SEL may be prevented and simultaneously the occurrence of the parasitic capacitance may be reduced through the auxiliary sensing line a-SEL' on the gate insulating layer 103.

Because the fifth connector NM5 is electrically connected to the auxiliary sensing line a-SEL' and overlaps a portion of the first electrode 211, a parasitic capacitance may occur therebetween theoretically. However, because the area of the fifth connector NM5 is very small, the occurrence of the parasitic capacitance is very trivial, and thus, distortion issue of sensing information almost does not occur.

Referring to FIG. 9, the sensing line SEL extends in the y-direction. The auxiliary sensing line a-SEL' is arranged on the gate insulating layer 103 as described above with reference to FIG. 8. It is shown in FIG. 9 that the auxiliary sensing line a-SEL' is electrically connected to the sensing line SEL through the fourth connector NM4 arranged over the auxiliary sensing line a-SEL'. The fourth connector NM4 may be arranged on the interlayer insulating layer 105, connected to the auxiliary sensing line a-SEL' through the thirteenth contact hole CT13 passing through the interlayer insulating layer 105, and connected to the sensing line SEL through the twelfth contact hole CT12 passing through the interlayer insulating layer 105, the gate insulating layer 103, and the buffer layer 101.

As shown in FIG. 9, the fourth connector NM4 may be arranged in the same layer as the scan line SL and the auxiliary line AL, for example, on the interlayer insulating layer 105. The control line CL (see FIG. 6) may be also arranged on the interlayer insulating layer 105.

Figure 10:
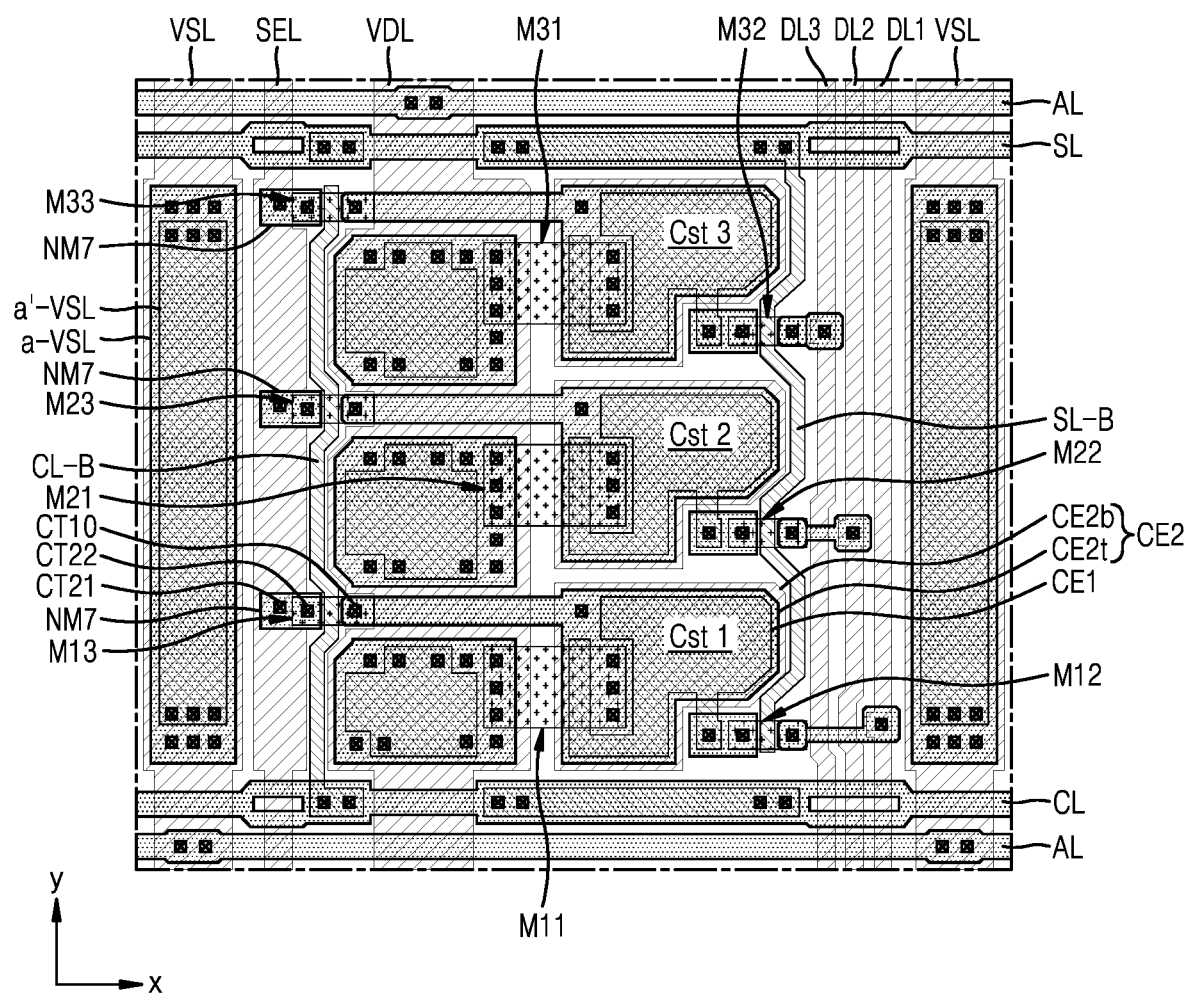
FIG. 10 is a plan view of pixel circuits of a light-emitting panel according to another embodiment.
Figure 11:
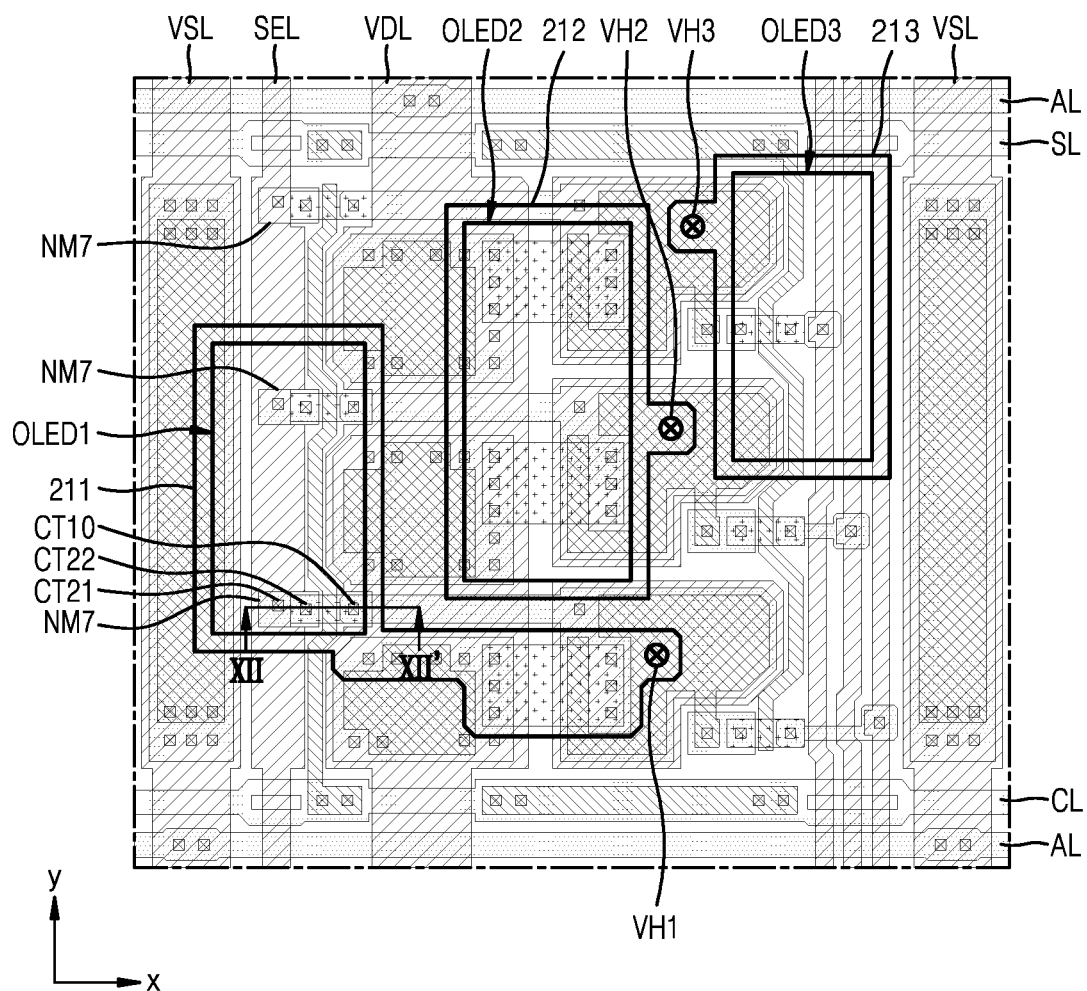
FIG. 11 is a plan view of light-emitting diodes arranged on pixel circuits of FIG. 10.
Figure 12:
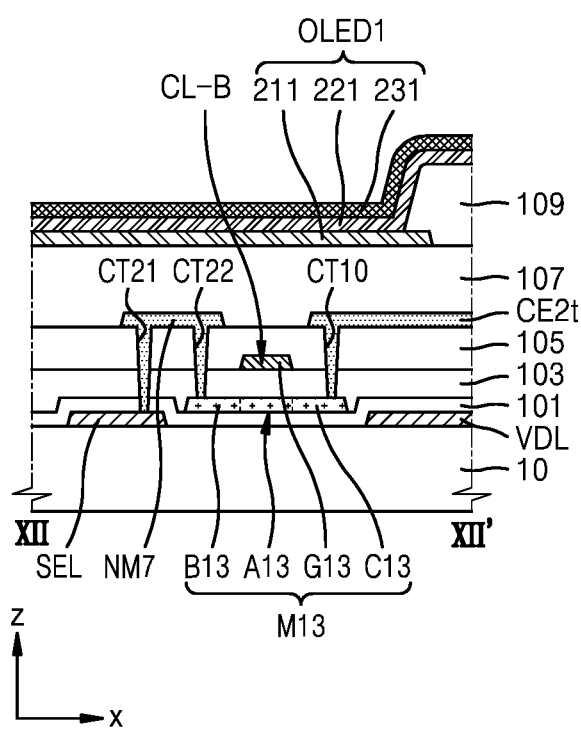
FIG. 12 is a cross-sectional view of a portion of a light-emitting diode taken along line XII-XII' of FIG. 11.

FIG. 10 is a plan view of pixel circuits of a light-emitting panel according to another embodiment, FIG. 11 is a plan view of light-emitting diodes arranged on pixel circuits of FIG. 10, and FIG. 12 is a cross-sectional view of the light-emitting diode taken along line XII-XII' of FIG. 11.

Referring to FIG. 10, the light-emitting panel may include the scan line SL, the control line CL, and the auxiliary line AL extending in the x-direction, and the first to third data lines DL1, DL2, and DL3, the sensing line SEL, the driving voltage line VDL, and the common voltage line VSL extending in the y-direction.

The transistors and the storage capacitors corresponding to the first to third pixel circuits may be arranged between two common voltage lines VSL that are adjacent to each other. With regard to this, FIG. 10 shows the first to third driving transistors M11, M21, and M31, the first to third switching transistors M12, M22, and M32, the first to third sensing transistors M13, M23, and M33, and the first to third storage capacitors Cst1, Cst2, and Cst3.

The first electrode of the light-emitting diode may overlap the transistor(s) and/or a line therebelow. In an embodiment, as shown in FIG. 11, the first electrode 211 of the first organic light-emitting diode OLED1 may overlap the first sensing transistor M13, the second sensing transistor M23, and the driving voltage line VDL. As an example, the first electrode 211 of the first organic light-emitting diode OLED1 may overlap the first sensing semiconductor layer A13 and the first sensing gate electrode G13 of the first sensing transistor M13, overlap the second sensing semiconductor layer and the second sensing gate electrode of the second sensing transistor M23, and overlap the driving voltage line VDL.

FIG. 10 shows the auxiliary common voltage lines a-VSL and a'-VSL and the corresponding structures are the same as those described with reference to FIGS. 6 and 8. The structures of the auxiliary common voltage lines a-VSL and a'-VSL shown in FIG. 10 are applicable to the embodiment described with reference to FIG. 3 and embodiments described below (see FIGS. 13 and 17).

According to the embodiments described with reference to FIGS. 3 and 6, though it is shown that the auxiliary sensing lines a-SEL and a-SEL' electrically connected to the sensing line SEL overlap the sensing line SEL, the light-emitting panel does not include the auxiliary sensing lines a-SEL and a-SEL' according to the embodiment of FIG. 10. The first electrode of the organic light-emitting diode, for example, the first electrode 211 of the first organic light-emitting diode OLED1 may overlap the sensing line SEL shown in FIG. 11.

The sensing line SEL is electrically connected to the sensing transistors, for example, the first to third sensing transistors M13, M23, and M33. With regard to this, it is shown in FIG. 10 that the sensing line SEL is electrically connected to the first to third sensing transistors M13, M23, and M33 through a seventh connector NM7.

Referring to FIG. 12, the sensing line SEL may be arranged on the first substrate 10 and covered by the buffer layer 101. As described above, the semiconductor layer may be arranged on the buffer layer 101. With regard to this, FIG. 12 shows the first sensing semiconductor layer A13.

The first sensing semiconductor layer A13 includes the channel region, the first low-resistance region B13, and the second low-resistance region C13, the channel region overlapping the first sensing gate electrode G13, and the first low-resistance region B13 and the second low-resistance region C13 being on two opposite sides of the channel region. The first low-resistance region B13 may be connected to the sensing line SEL through the seventh connector NM7. The seventh connector NM7 may be connected to the sensing line SEL through a $21^{st}$ contact hole CT21 passing through the buffer layer 101, the gate insulating layer 103, and the interlayer insulating layer 105 and connected to the first low-resistance region B13 through a $22^{nd}$ contact hole CT22 passing through the gate insulating layer 103 and the interlayer insulating layer 105. The second low-resistance region C13 may be electrically connected to the second capacitor electrode, for example, the second sub-electrode CE2t through the tenth contact hole CT10.

The first organic light-emitting diode OLED1 may overlap the sensing line SEL while being arranged on the via insulating layer 107. With regard to this, it shown in FIG. 12 that the first electrode 211 of the first organic light-emitting diode OLED1 is arranged on the via insulating layer 107 and overlaps the sensing line SEL. The first organic light-emitting diode OLED1 includes the emission layer 221 and the second electrode 231 on the first electrode 211, and specific structure and material thereof are the same as those described above.

According to the embodiment shown in FIG. 12, because the auxiliary sensing line a-SEL (see FIG. 3) is not provided on the interlayer insulating layer 105, a parasitic capacitance does not occur between the auxiliary sensing line a-SEL and the first electrode 211. In addition, because a distance (a distance in the z-direction) between the sensing line SEL and the first electrode 211 is sufficiently secured, a parasitic capacitance does not occur between the sensing line SEL and the first electrode 211. Though the seventh connector NM7 is electrically connected to the sensing line SEL and overlaps the first electrode 211 of the first organic light-emitting diode OLED1 in the z-direction, the overlapping area of the seventh connector NM7 and the first electrode 211 is very small. Accordingly, distortion of sensing information due to the occurrence of the parasitic capacitance may not occur. Accordingly, the first electrode 211 may be arranged without limitation of the position of the sensing line SEL, and an emission area (an aperture ratio) of the first organic light-emitting diode OLED1 may be sufficiently secured.

Figure 13:
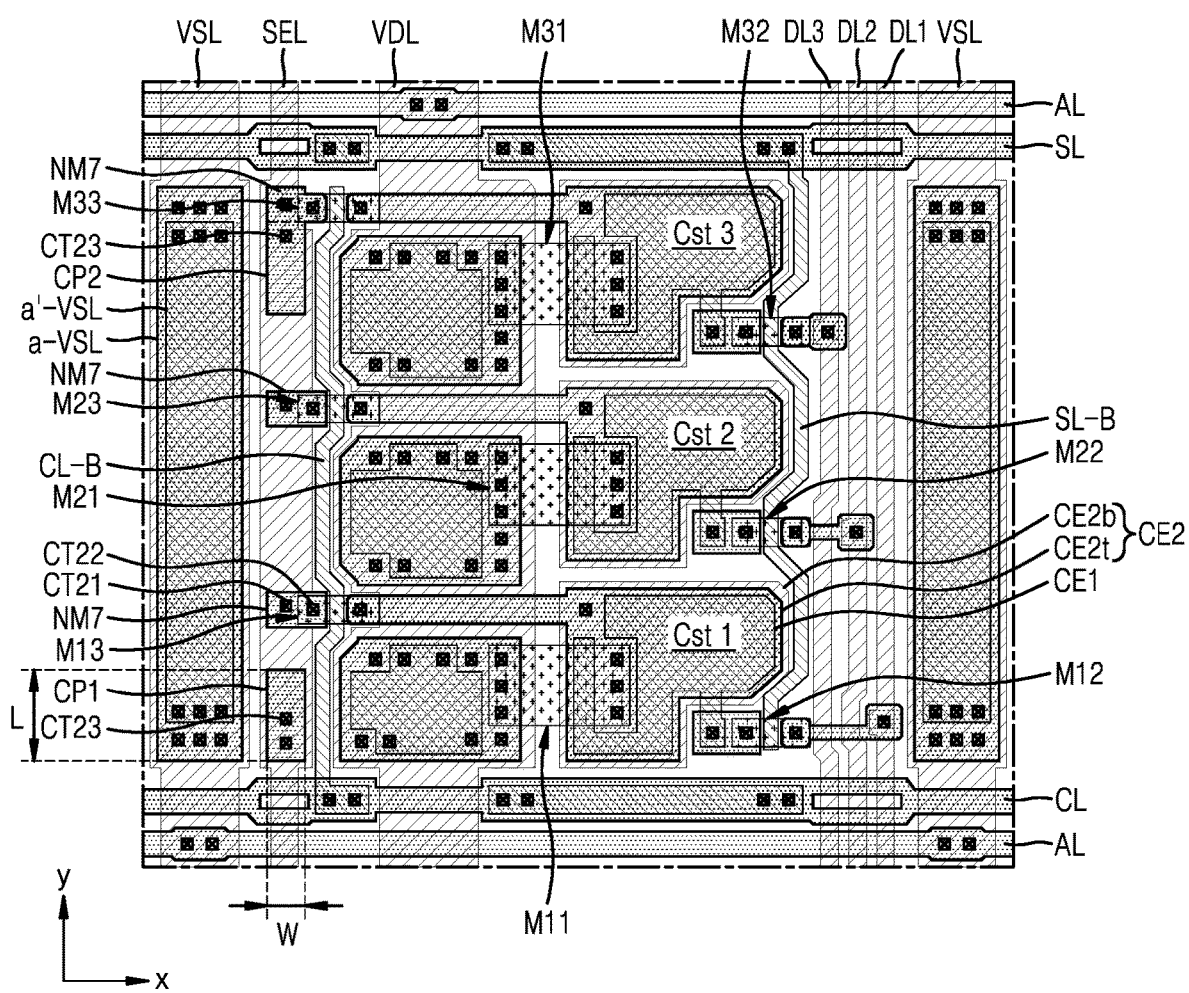
FIG. 13 is a plan view of pixel circuits of a light-emitting panel according to another embodiment.
Figure 14:
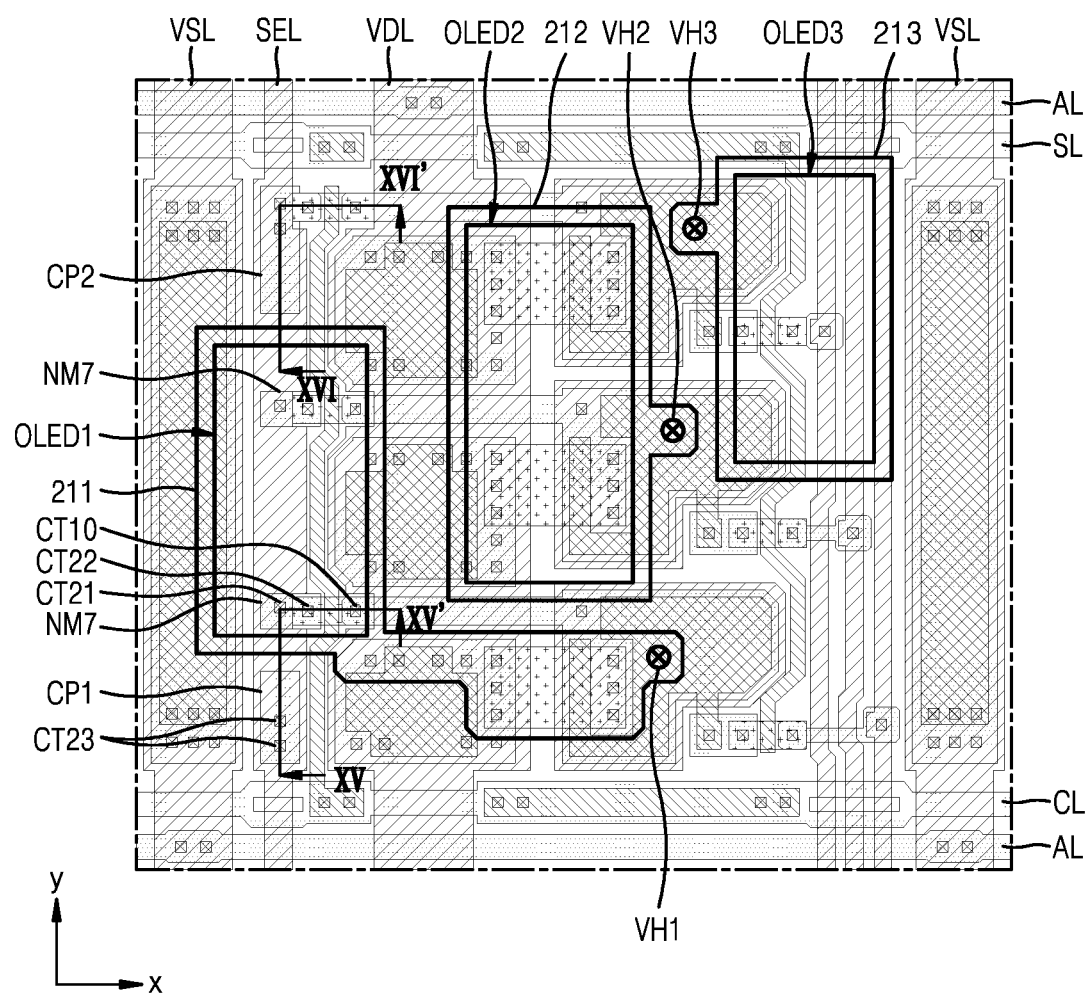
FIG. 14 is a plan view of light-emitting diodes arranged on pixel circuits of FIG. 13.

FIG. 13 is a plan view of pixel circuits of a light-emitting panel according to another embodiment, and FIG. 14 is a plan view of light-emitting diodes arranged on pixel circuits of FIG. 13.

Referring to FIG. 13, the light-emitting panel may include transistors and storage capacitors corresponding to the first to third pixel circuits arranged between two common voltage lines VSL that are adjacent to each other. As shown in FIG. 13, the first to third driving transistors M11, M21, and M31, the first to third switching transistors M12, M22, and M32, the first to third sensing transistors M13, M23, and M33, and the first to third storage capacitors Cst1, Cst2, and Cst3 may be arranged in a region between the two common voltage lines adjacent to each other and between the two auxiliary lines AL adjacent to each other.

The configuration of the pixel circuits shown in FIG. 13 includes the structures described above with reference to FIG. 10 and may further include a conductive part arranged on the sensing line SEL. With regard to this, FIG. 13 shows two conductive parts, for example, a first conductive part CP1 and a second conductive part CP2 overlapping the sensing line SEL and arranged between the scan line SL and the control line CL in a plan view. Though FIG. 13 shows two conductive parts, the number of conductive parts may be variously changed. As an example, one conductive part may be arranged between the scan line SL and the control line CL or three or more conductive parts may be arranged between the scan line SL and the control line CL.

The conductive part, for example, the first conductive part CP1 and the second conductive part CP2 may be electrically connected to the sensing line SEL to reduce the resistance of the sensing line SEL. The first conductive part CP1 and the second conductive part CP2 may be connected to the sensing line SEL through a $23^{rd}$ contact hole CT23. Each of the first conductive part CP1 and the second conductive part CP2 may a length thereof greater than a width thereof, the length extending in a lengthwise direction (the y-direction) of the sensing line SEL, and the width extending in the x-direction. As an example, it is shown in FIG. 13 that a width W of the first conductive part CP1 in the x-direction is less than a length L in the y-direction. Though FIG. 13 shows a width W and a length L of the first conductive part CP1, the width of the second conductive part CP2 in the x-direction may be less than a length in the y-direction.

In this case, the conductive part does not overlap the first electrodes 211, 212, and 213 of the first to third organic light-emitting diodes OLED1, OLED2, and OLED3. With regard to this, it is shown in FIG. 14 that the first conductive part CP1 and the second conductive part CP2 are apart from each other around the first electrode 211.

Figure 15:
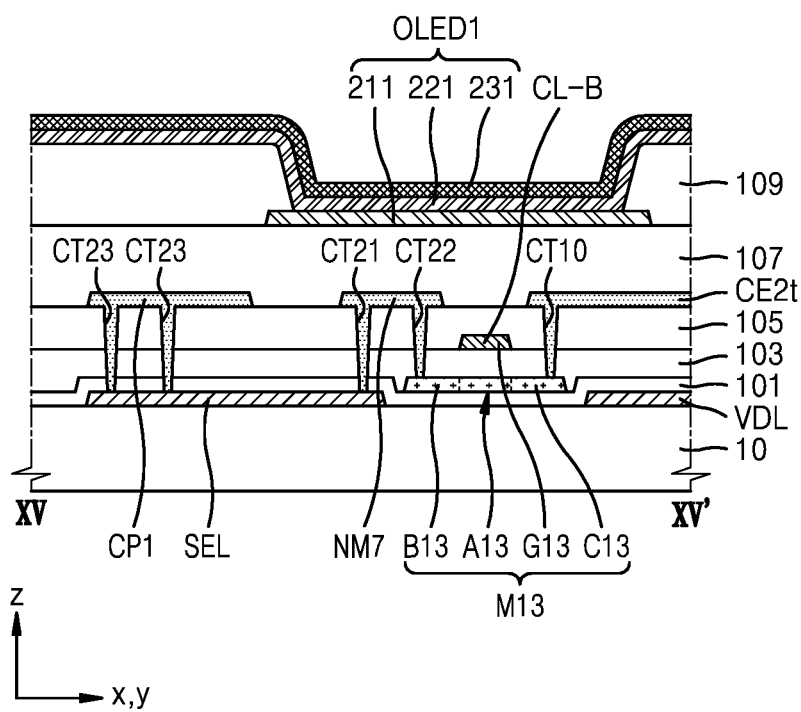
FIG. 15 is a cross-sectional view of a light-emitting diode taken along line XV-XV' of FIG. 14.
Figure 16:
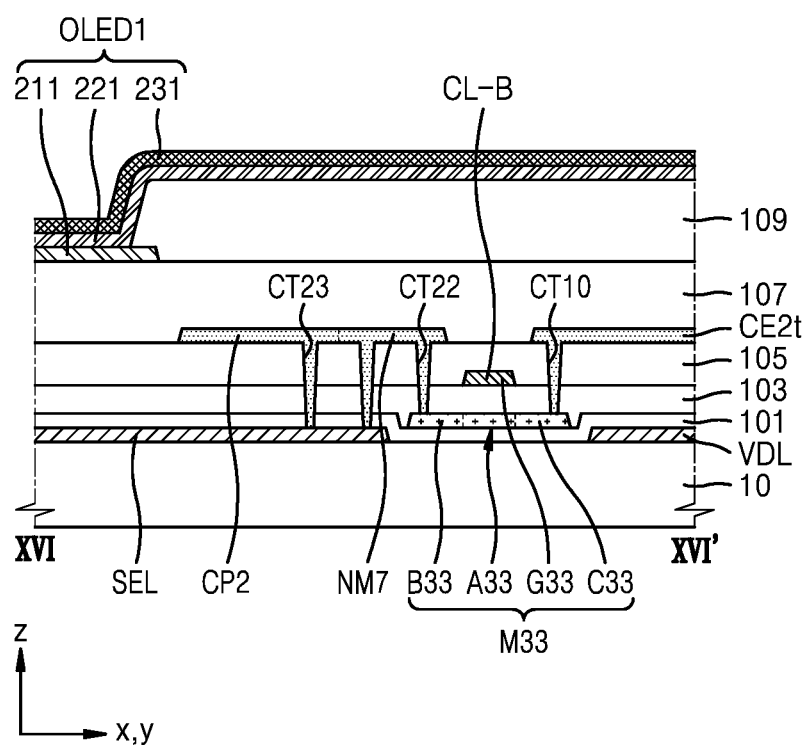
FIG. 16 is a cross-sectional view of a portion of a light-emitting diode taken along line XVI-XVI' of FIG. 15.

FIG. 15 is a cross-sectional view of the light-emitting diode taken along line XV-XV' of FIG. 14, and FIG. 16 is a cross-sectional view of a portion the light-emitting diode taken along line XVI-XVI' of FIG. 15.

Referring to FIG. 15, the first conductive part CP1 may be arranged over the sensing line SEL with an insulating layer therebetween. The first conductive part CP1 may be connected to the sensing line SEL through a $23^{rd}$ contact hole CT23 passing through the buffer layer 101, the gate insulating layer 103, and the interlayer insulating layer 105. The first conductive part CP1 may be arranged on the interlayer insulating layer 105.

The sensing line SEL is electrically connected to the sensing transistor. With regard to this, it is shown in FIG. 15 that the seventh connector NM7 on the interlayer insulating layer 105 is connected to the sensing line SEL through the $21^{st}$ contact hole CT21 and connected to the first low-resistance region B13 of the first sensing semiconductor layer A13 through the $22^{nd}$ contact hole CT22. The structure of the first sensing transistor M13 including the first sensing semiconductor layer A13 is the same as that described above.

The first electrode of the organic light-emitting diode, for example, the first electrode 211 of the first organic light-emitting diode OLED1 does not overlap the first conductive part CP1. Because the first conductive part CP1 connected to the sensing line SEL has a preset length (e.g. the width of the first conductive part CP1 connected in the x-direction is less than a length thereof in the y-direction), the resistance of the sensing line SEL may be reduced. Though the seventh connector NM7 connected to the sensing line SEL overlaps the first electrode 211 of the first organic light-emitting diode OLED1 over the interlayer insulating layer 105, the overlapping area of the seventh connector NM7 and the first electrode 211 of the first organic light-emitting diode OLED1 is very small. Accordingly, distortion of sensing information due to a parasitic capacitance may be ignored. That is, referring to FIGS. 13 and 14, the occurrence of a parasitic capacitance may be prevented while the resistance of the sensing line SEL is reduced through a conductive part having a width in the x-direction less than a length in the y-direction and not overlapping the first electrode of the light-emitting diode, for example, the first and second conductive parts CP1 and CP2.

Referring to FIG. 16, the second conductive part CP2 may be arranged on the interlayer insulating layer 105. The second conductive part CP2 may be connected to the sensing line SEL through the $23^{rd}$ contact hole CT23 passing through insulating layers therebetween, for example, the buffer layer 101, the gate insulating layer 103, and the interlayer insulating layer 105. Like the first conductive part CP1, the second conductive part CP2 may have a preset length (e.g., a length thereof in the y-direction is greater than a width thereof in the x-direction) and be electrically connected to the sensing line SEL to reduce the resistance of the sensing line SEL.

The second conductive part CP2 may be one body with the seventh connector NM7. As shown in FIGS. 14 and 15, the seventh connector NM7 overlapping the first electrode 211 of the first organic light-emitting diode OLED1 and electrically connected to the first and second sensing transistors M13 and M23 is apart from the first conductive part CP1. In contrast, the connector not overlapping the first electrode 211 of the first organic light-emitting diode OLED1, for example, the seventh connector NM7 electrically connected to the third sensing transistor M33 may be formed as one body with the second conductive part CP2.

The seventh connector NM7 may be connected to the first low-resistance region B33 of the third sensing semiconductor layer A33 of the third sensing transistor M33. A second low-resistance region C33 of the third sensing semiconductor layer A33 may be connected to the second capacitor electrode, for example, the second sub-electrode CE2t.

As shown in FIGS. 14 to 16, the first conductive part CP1 and the second conductive part CP2 do not overlap the first electrode 211. That is, when projected in a direction (the z-direction) perpendicular to the first substrate 10, the first electrode 211 does not overlap the first conductive part CP1 and the second conductive part CP2. Because the first conductive part CP1 and the second conductive part CP2 are electrically connected to the sensing line SEL, in the case where a parasitic capacitance occurs between the first electrode 211 and the second conductive part CP2, it is difficult to obtain sensing information through the sensing line SEL due to the parasitic capacitance. In contrast, in the case where the second conductive part CP2 does not overlap the first electrode 211 of the first organic light-emitting diode OLED1, the occurrence of the parasitic capacitance may be reduced while the resistance of the sensing line SEL is reduced.

Figure 17:
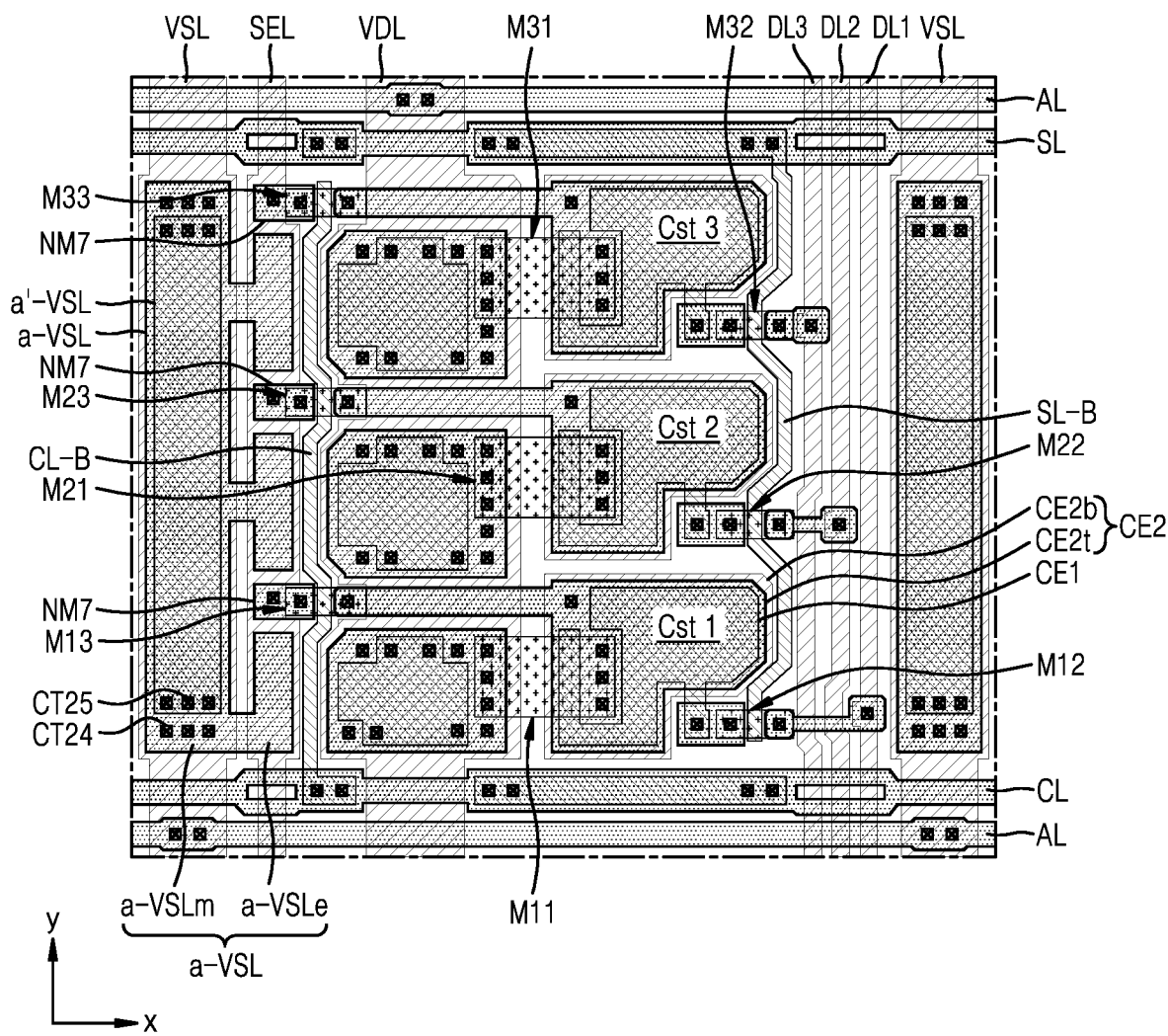
FIG. 17 is a plan view of pixel circuits of a light-emitting panel according to another embodiment.
Figure 18:
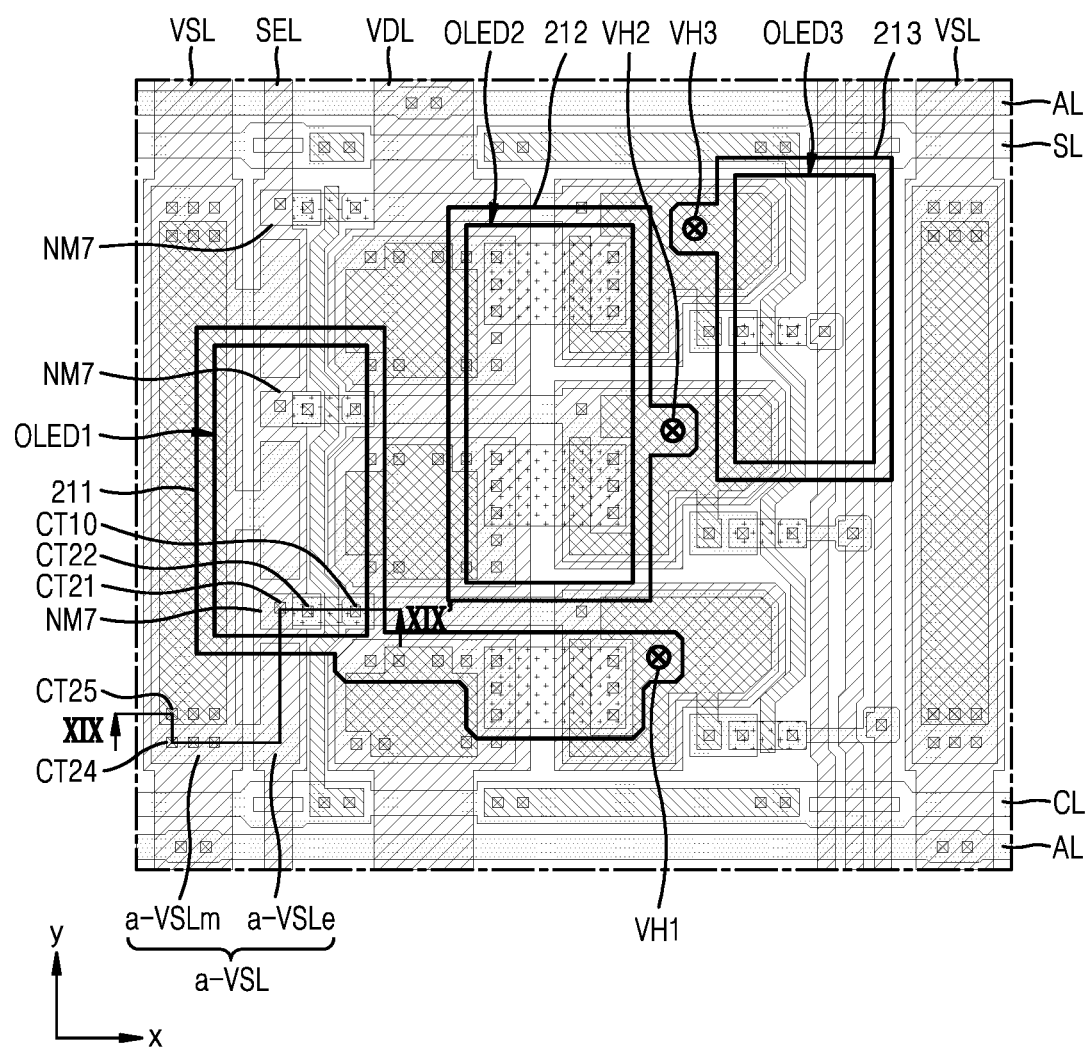
FIG. 18 is a plan view of light-emitting diodes arranged on pixel circuits of FIG. 17.
Figure 19:
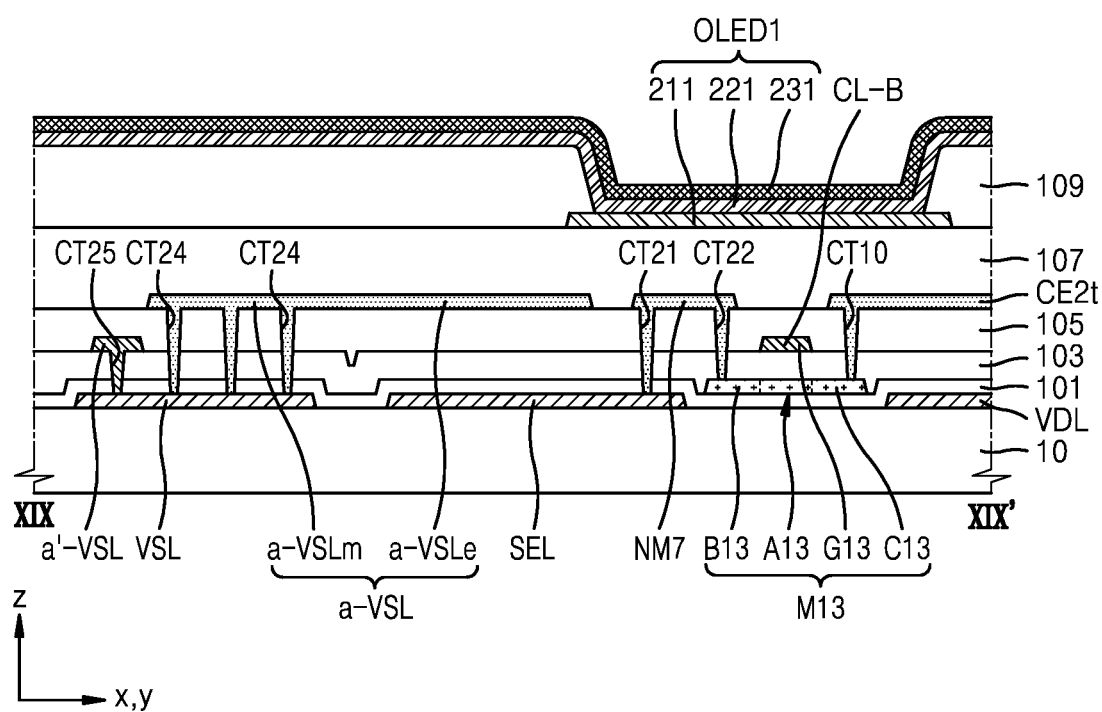
FIG. 19 is a cross-sectional view of a light-emitting diode taken along line XIX-XIX' of FIG. 18.

FIG. 17 is a plan view of pixel circuits of a light-emitting panel according to another embodiment, FIG. 18 is a plan view of light-emitting diodes arranged on pixel circuits of FIG. 17, and FIG. 19 is a cross-sectional view of the light-emitting diode taken along line XIX-XIX' of FIG. 18.

Referring to FIG. 17, the light-emitting panel may include the scan line SL, the control line CL, the auxiliary line extending in the x-direction, the first to third data lines DL1, DL2, and DL3, the sensing line SEL, the driving voltage line VDL, and the common voltage line VSL extending in the y-direction.

The transistors and the storage capacitors corresponding to the first to third pixel circuits may be arranged between two common voltage lines VSL that are adjacent to each other. With regard to this, FIG. 17 shows the first to third driving transistors M11, M21, and M31, the first to third switching transistors M12, M22, and M32, the first to third sensing transistors M13, M23, and M33, and the first to third storage capacitors Cst1, Cst2, and Cst3.

The structure of the pixel circuits shown in FIG. 17 includes the structure described above with reference to FIG. 10 and is different in that a portion of the auxiliary common voltage line electrically connected to the common voltage line VSL extends between the sensing line SEL and the first electrode of the organic light-emitting diode.

The auxiliary common voltage line electrically connected to the common voltage line VSL may be arranged on the common voltage line VSL. With regard to this, FIG. 17 shows the first auxiliary common voltage line a-VSL and the second auxiliary common voltage line a'-VSL.

The first auxiliary common voltage line a-VSL may be arranged on the interlayer insulating layer 105, and the second auxiliary common voltage line a'-VSL may be arranged on the gate insulating layer 103. As shown in FIGS. 17 and 19, the first auxiliary common voltage line a-VSL may be electrically connected to the common voltage line VSL through a $24^{th}$ contact hole CT24. Similarly, the second auxiliary common voltage line a'-VSL may be electrically connected to the common voltage line VSL through a $25^{th}$ contact hole CT25 as shown in FIGS. 17 and 19.

At least one of the first auxiliary common voltage line a-VSL and the second auxiliary common voltage line a'-VSL electrically connected to the common voltage line VSL may include a main portion and an extension portion, the main portion overlapping the common voltage line VSL, and the extension portion extending from the main portion and being arranged between the sensing line SEL and the first electrode of the organic light-emitting diode. The extension portion of at least one of the first auxiliary common voltage line a-VSL and the second auxiliary common voltage line a'-VSL extending between the sensing line SEL and the first electrode of the organic light-emitting diode may have a voltage level such as the common voltage line VSL, which has a constant voltage. The extension portion may suppress the parasitic capacitance between the sensing line SEL and the first electrode of the organic light-emitting diode.

With regard to this, it is shown in FIGS. 18 and 19 that the first auxiliary common voltage line a-VSL includes a main portion a-VSLm and an extension portion a-VSLe, the extension portion a-VSLe extending from the main portion a-VSLm and being arranged between the first electrode 211 of the first organic light-emitting diode OLED1 and the sensing line SEL. The main portion a-VSLm of the first auxiliary common voltage line a-VSL may overlap the common voltage line VSL, and the extension portion a-VSLe of the first auxiliary common voltage line a-VSL may overlap the first electrode 211 of the first organic light-emitting diode OLED1 and the sensing line SEL. When projected in the direction (the z-direction) perpendicular to the first substrate 10, a portion of the first electrode 211 of the first organic light-emitting diode OLED1, a portion of the extension portion a-VSLe of the first auxiliary common voltage line a-VSL, and a portion of the sensing line SEL may overlap one another.

Though it is shown in FIG. 19 that the extension portion a-VSLe of the first auxiliary common voltage line a-VSL is arranged between the first electrode 211 of the first organic light-emitting diode OLED1 and the sensing line SEL, the extension portion a-VSLe being formed in the same layer as the second sub-electrode CE2t of the second capacitor electrodes and including the same material as that of the second sub-electrode CE2t, the embodiment is not limited thereto. In another embodiment, a portion of the second auxiliary common voltage line a'-VSL may overlap the first electrode 211 of the first organic light-emitting diode OLED1 and the sensing line SEL between the first electrode 211 of the first organic light-emitting diode OLED1 and the sensing line SEL. The second auxiliary common voltage line a'-VSL may be formed in the same layer as the first sensing gate electrode G13 and may include the same material as that of the first sensing gate electrode G13.

According to the embodiments described with reference to FIGS. 3 to 19, it is shown that the first electrode 211 of the first organic light-emitting diode OLED1 among the first to third organic light-emitting diodes OLED1, OLED2, and OLED3 overlaps the first sensing transistor M11. As an example, though the above embodiments describe that the first electrode 211 of the first organic light-emitting diode OLED1 overlaps the sensing semiconductor layer A13 and the sensing gate electrode G13 of the first sensing transistor M11, the embodiment is not limited thereto. In another embodiment, the configurations of the first to third organic light-emitting diodes OLED1, OLED2, and OLED3 may be different from that shown in FIGS. 4, 7, 11, and 18. In this case, the first electrode of one of the second third organic light-emitting diodes OLED2 and OLED3 may overlap the first sensing transistor M11.

According to the embodiments described with reference to FIGS. 3 to 19, though the first electrode of the light-emitting diode, for example, the organic light-emitting diode overlaps the first sensing transistor M11, the embodiment is not limited thereto. In another embodiment, the first electrode of the organic light-emitting diode may overlap another sensing transistor, for example, the second and/or third sensing transistors M12 and/or M13 instead of the first sensing transistor M11.

According to the embodiments, a parasitic capacitance between the sensing line and neighboring electrode (e.g., the first electrode of the light-emitting diode) may be prevented. However, the scope of the present disclosure is not limited by this effect.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:
1. A display apparatus comprising:
a first substrate;
a scan line that extends in a first direction over the first substrate;
a data line that extends in a second direction crossing the first direction;
a sensing line that extends in the second direction;
a switching transistor electrically connected to the scan line and the data line;

a driving transistor electrically connected to the switching transistor;
a sensing transistor electrically connected to the driving transistor and electrically connected to the sensing line;
a first insulating layer arranged between the first substrate and a sensing semiconductor layer of the sensing transistor;
a via insulating layer provided on the switching transistor, the driving transistor, and the sensing transistor; and
a light-emitting diode including a first electrode, an emission layer, and a second electrode, the first electrode being provided on the via insulating layer, the emission layer being provided on the first electrode, and the second electrode being provided on the emission layer,
wherein the sensing line is arranged below the first insulating layer and overlaps the first electrode of the light-emitting diode.

2. The display apparatus of claim 1, wherein the sensing semiconductor layer of the sensing transistor overlaps the first electrode of the light-emitting diode.

3. The display apparatus of claim 1, further comprising an auxiliary sensing line that overlaps the sensing line and that is arranged in a same layer as a sensing gate electrode of the sensing transistor.

4. The display apparatus of claim 3, wherein the auxiliary sensing line overlaps the first electrode of the light-emitting diode.

5. The display apparatus of claim 3, wherein the auxiliary sensing line includes a same material as that of the sensing gate electrode.

6. The display apparatus of claim 3, further comprising a connector arranged on the auxiliary sensing line and that electrically connects the auxiliary sensing line to the sensing semiconductor layer of the sensing transistor.

7. The display apparatus of claim 1, further comprising a connector electrically that connects a portion of the sensing semiconductor layer to the sensing line.

8. The display apparatus of claim 7, further comprising:
a second insulating layer provided on the sensing semiconductor layer; and
a third insulating layer provided on the second insulating layer,
wherein the sensing semiconductor layer includes a sensing gate electrode arranged on the second insulating layer, and the connector is arranged on the third insulating layer.

9. The display apparatus of claim 8, further comprising a conductive part arranged on the sensing line, that overlaps a portion of the sensing line, and that is connected to the sensing line.

10. The display apparatus of claim 9, wherein the conductive part is arranged on the third insulating layer and does not overlap the first electrode of the light-emitting diode.

11. The display apparatus of claim 9, wherein a width of the conductive part in the first direction is less than a length of the conductive part in the second direction.

12. The display apparatus of claim 8, further comprising:
a common voltage line extending in the second direction; and
an auxiliary common voltage line arranged on the common voltage line and electrically connected to the common voltage line.

13. The display apparatus of claim 12, wherein the auxiliary common voltage line includes:

a main portion that overlaps the common voltage line; and
an extension portion that extends from the main portion and that overlaps the sensing line and the first electrode of the light-emitting diode.

14. A display apparatus comprising:
a light-emitting panel including light-emitting diodes; and
a color panel arranged on the light-emitting panel and configured to convert or transmit light emitted from the light-emitting diodes,
wherein the light-emitting panel includes:
a first substrate;
a scan line that extends in a first direction over the first substrate;
a data line that extends in a second direction crossing the first direction;
a sensing line that extends in the second direction;
a switching transistor electrically connected to the scan line and the data line;
a driving transistor electrically connected to the switching transistor;
a sensing transistor electrically connected to the driving transistor and electrically connected to the sensing line; and
a first insulating layer arranged between the first substrate and a sensing semiconductor layer of the sensing transistor,
wherein the sensing line overlaps a first electrode of one of the light-emitting diodes and is arranged under the first insulating layer.

15. The display apparatus of claim 14, further comprising an auxiliary sensing line that overlaps the sensing line and arranged in a same layer as a sensing gate electrode of the sensing transistor.

16. The display apparatus of claim 15, wherein the auxiliary sensing line overlaps the first electrode and includes a same material as the sensing gate electrode.

17. The display apparatus of claim 14, further comprising a connector electrically that connects a portion of the sensing semiconductor layer to the sensing line.

18. The display apparatus of claim 17, further comprising:
a second insulating layer provided on the sensing semiconductor layer; and
a third insulating layer provided on the second insulating layer,
wherein the sensing semiconductor layer includes a sensing gate electrode arranged on the second insulating layer, and the connector is arranged on the third insulating layer.

19. The display apparatus of claim 18, further comprising a conductive part arranged on the sensing line, that overlaps a portion of the sensing line, and that is connected to the sensing line.

20. The display apparatus of claim 19, wherein the conductive part is arranged on the third insulating layer and does not overlap the first electrode.

21. The display apparatus of claim 14, further comprising:
a common voltage line extending in the second direction; and
an auxiliary common voltage line arranged on the common voltage line and electrically connected to the common voltage line,
wherein a portion of the auxiliary common voltage line overlaps the sensing line and the first electrode.

* * * * *